(12) United States Patent
Park et al.

(10) Patent No.: US 9,257,185 B2
(45) Date of Patent: Feb. 9, 2016

(54) NONVOLATILE MEMORY DEVICE, NONVOLATILE MEMORY SYSTEM, PROGRAM METHOD THEREOF, AND OPERATION METHOD OF CONTROLLER CONTROLLING THE SAME

(75) Inventors: Il Han Park, Suwon-si (KR); Yongsung Cho, Suwon-si (KR); Sang-Soo Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 512 days.

(21) Appl. No.: 13/618,605

(22) Filed: Sep. 14, 2012

(65) Prior Publication Data

US 2013/0188426 A1 Jul. 25, 2013

(30) Foreign Application Priority Data

Jan. 19, 2012 (KR) .......................... 10-2012-006098

(51) Int. Cl.
*G11C 16/10* (2006.01)
*G11C 16/24* (2006.01)
*G11C 16/34* (2006.01)

(52) U.S. Cl.
CPC ................ *G11C 16/10* (2013.01); *G11C 16/24* (2013.01); *G11C 16/3427* (2013.01)

(58) Field of Classification Search
CPC ........... G11C 11/5628; G11C 16/3457; G11C 16/3459; G11C 16/10; G11C 16/24
USPC ......................... 365/185.22, 185.24, 185.02
See application file for complete search history.

(56) References Cited

U.S. PATENT DOCUMENTS

| | | | |
|---|---|---|---|
| 7,619,925 B2 * | 11/2009 | Chang et al. ............. | 365/185.16 |
| 7,773,414 B2 | 8/2010 | Hemink | |
| 8,000,145 B2 * | 8/2011 | Lim .......................... | 365/185.17 |
| 2007/0189073 A1 * | 8/2007 | Aritome .................... | 365/185.18 |
| 2009/0073761 A1 | 3/2009 | Hemink | |
| 2010/0074016 A1 | 3/2010 | Higashitani | |
| 2011/0096605 A1 | 4/2011 | Kosaki et al. | |
| 2012/0069667 A1 * | 3/2012 | Shirakawa ............... | 365/185.17 |

FOREIGN PATENT DOCUMENTS

| KR | 20110001572 U | 1/2011 |
|---|---|---|
| KR | 20110001574 U | 1/2011 |

* cited by examiner

*Primary Examiner* — Douglas King
(74) *Attorney, Agent, or Firm* — Harness, Dickey & Pierce, P.L.C.

(57) ABSTRACT

According to example embodiments, a nonvolatile memory device includes a first memory cell configured to store a first data pattern, a second memory cell configured to be programmed using a program voltage, and a coupling program control unit. The coupling program control unit may be configured to perform a verification operation for verifying whether the first memory cell is programmed with the first data pattern. The verification operation may provide to the first memory cell a verification voltage corresponding to the first data pattern. The coupling program control unit may be configured to end programming the second memory cell when the verification operation on the first memory cell indicates a pass.

19 Claims, 23 Drawing Sheets

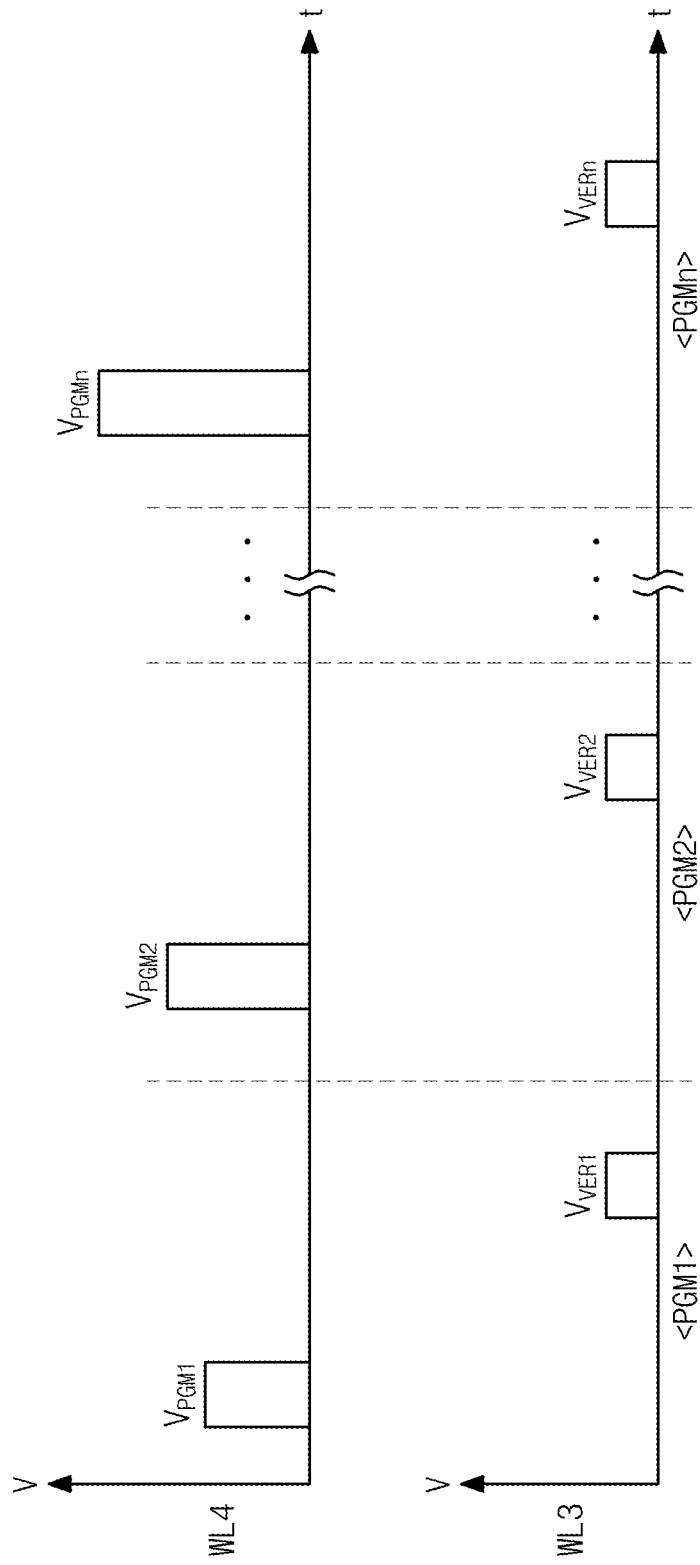

NONVOLATILE MEMORY DEVICE, NONVOLATILE MEMORY SYSTEM, PROGRAM METHOD THEREOF, AND OPERATION METHOD OF CONTROLLER CONTROLLING THE SAME

CROSS-REFERENCE TO RELATED APPLICATIONS

This application claims priority under 35 U.S.C §119 to Korean Patent Application No. 10-2012-0006098, filed on Jan. 19, 2012, the entire disclosure of which is incorporated by reference herein.

BACKGROUND

Example embodiments of inventive concepts relate to a semiconductor memory device, and more particularly, to a nonvolatile memory device including a coupling program control unit and/or a method of operating the same.

Semiconductor memory devices may include volatile memories, such as DRAM and/or SRAM. Semiconductor memory devices may also include nonvolatile memories such as EEPROM, FRAM, PRAM, MRAM, flash memory, and the like. A volatile memory may lose data stored therein at power-off, while a nonvolatile memory may retain data stored therein even at power-off. In particular, a flash memory device may have merits such as a high programming speed, low power consumption, a mass storage capacity, and the like. For this reason, the flash memory device may be widely used as a storage medium of a computer system.

A flash memory device may store single bit data or two or more data bits (or, referred to as a multi-bit data) per memory cell. A flash memory device storing single bit data per memory cell may be referred to as an SLC flash memory device, and may have an erase state and a program state according to a threshold voltage distribution. A flash memory device storing multi-bit data per memory cell may be referred to as an MLC flash memory device, and may have an erase state and a plurality of program states according to a threshold voltage distribution.

In the MLC flash memory device, it is important to secure the read margin between program states. However, threshold voltages may vary due to various factors at programming.

SUMMARY

According to example embodiments of inventive concepts, a flash memory device includes a first memory cell configured storing a first data pattern; a second memory cell configured to be programmed using a program voltage; and a coupling program control unit. The coupling program control unit is configured to perform a verification operation for verifying whether the first data pattern of the first memory cell is programmed with the first data pattern. The verification operation may provide to the first memory cell a verification voltage corresponding to the first data pattern. The coupling program control unit is configured to end programming the second memory cell when the verification operation on the first memory cell indicates a pass.

The coupling program control unit may be configured to continue programming the second memory cell when the verification operation on the first memory cell indicates a fail.

A memory controller may be connected to the first and second memory cells. The second memory cell may be a dummy memory cell that does not have a data pattern provided from a memory controller.

The first memory cell may be connected to a first word line and the second memory cell may be connected to a second word line.

The first and second word lines may be adjacent to each other.

The first memory cell may be connected to a first bit line and the second memory cell may be connected to a second bit line.

The first and second bit lines may be different from each other.

The first data pattern may have an uppermost threshold voltage of a multi-level data pattern.

According to example embodiments of inventive concepts, a method of programming a nonvolatile memory device may include: programming a first memory cell; performing a verification operation to verify whether a second memory cell is programmed with a first data pattern, and terminating the programming of the second memory cell when the verification operation on the second memory cell indicates a pass.

The verification operation may include providing to the first memory cell a verification voltage corresponding to the first data pattern. Programming of the second memory cell may be terminated when the verification operation on the second memory cell indicates a pass.

The method may further include continuing the programming of the first memory cell when verification operation on the second memory cell indicates a fail, and supplying a program voltage to the first memory cell until the verification operation on the second memory cell passes.

The first data pattern may have an uppermost threshold voltage of a multi-level data pattern.

The first memory cell may be connected to a first word line and the second memory cell may be connected to a second word line.

The first and second word lines may be adjacent to each other.

The first memory cell may be connected to a first bit line and the second memory cell may be connected to a second bit line.

The first and second bit lines may be different from each other.

According to example embodiments of inventive concepts, a nonvolatile memory device may include: a first memory cell configured to store a first data pattern; a second memory cell configured to be supplied with a program voltage; and a coupling program control unit configured to provide the second memory cell with the program voltage according to the first data pattern and a program state of the first memory cell.

A memory controller may be connected to the first and the second memory cell. The second memory cell may be a dummy memory cell in which a data pattern provided from the memory controller is not stored.

The coupling program control unit may be further configured to perform a verification operation for verifying whether first memory cell is programmed with the first data pattern, the verification operation providing to the first memory cell a verification voltage corresponding the first data pattern. The coupling program control unit may be configured to provide the program voltage to the second memory cell when the verification operation on the first memory cell indicates a failure.

The first data pattern may have an uppermost threshold voltage of a multi-level data pattern.

The first and second memory cell may be adjacent to each other.

According to example embodiments of inventive concepts, a nonvolatile memory device may include: a first memory cell be configured to store a first data pattern; a second memory cell configured to be supplied with a program voltage according to information of the first data pattern; and a control logic. The control logic may be configured to control the supply of the program voltage to the second memory cell. The control logic may be configured to perform a verification operation for verifying whether the first memory cell is programmed with the first data pattern. The verification operation may include providing to the first memory cell a verification voltage corresponding to the first data pattern.

The control logic may be configured to supply the program voltage to the second memory cell again until the verification operation on the first memory cell indicates a pass.

The first memory cell may be connected to one of an uppermost and a lowermost word line of a memory block of the nonvolatile memory device. The second memory cell may be connected to a dummy word line of the memory block.

The first data pattern may have an uppermost threshold voltage of a multi-level data pattern.

The first memory cell may be connected to a first word line and the second memory cell may be connected to a second word line.

The first word line may be one of an uppermost and lowermost word line of a memory block of the nonvolatile memory device. The second word line may be a dummy word line.

A first bit line may be connected to the first memory cell and a second bit line may be connected to the second memory cell.

The first and second bit lines may be different from each other.

The first and second bit lines may be connected to a common bit line.

The control logic may be configured to control the supply of the program voltage so the program voltage is supplied to the second memory cell after the verification operation when the verification operation indicates a failure.

A third word line may be connected to the first memory cell and a fourth word line may be connected to the second memory cell.

The third and fourth word lines may be adjacent to each other.

According to example embodiments of inventive concepts, a nonvolatile memory device may include a first word line connected to a first memory cell, the first memory cell being configured to store first data pattern information; a page buffer connected to the first memory cell, the page buffer being configured to store the first data pattern information to be stored at the first memory cell; and a voltage generator connected to a second word line and the first word line, the voltage generator being configured to supply to the second word line a program voltage according to the first data pattern information, and the voltage generator being configured supply to the first word line a verification voltage corresponding to the first data pattern information.

The first word line may be an uppermost word line of a memory block of a memory cell array.

The first word line may be a lowermost word line of a memory block of a memory cell array.

The second word line may be a dummy word line.

The device may be configured so no dummy word line may have a data pattern provided from a memory controller.

The dummy word line and the first word line may be adjacent to each other.

The first data pattern may have an uppermost threshold voltage of a multi-level data pattern.

The page may be further configured to check a pass or fail or a data pattern of the first word line according to the verification voltage supplied to the first word line.

The voltage generator may be configured to supply to the second word line the program voltage again if a data pattern of the first word line is judged to be failed.

Example embodiments of inventive concepts relate to a method of programming a nonvolatile memory device including a plurality of memory cells connected to a plurality of word lines and a plurality of bit lines. The method includes: checking first data information to be programmed at a first word line; applying a first program voltage to a second word line based on the first data information; and judging completion of a first data pattern of the first word line by providing the first word line with a verification voltage corresponding to the first data information and checking a pass or fail of the first data information.

The first word line of the plurality of word lines may be adjacent to the second word line of the plurality of word lines.

The method may include providing the program voltage again to the second word line when the first data pattern is judged not to be completed.

The first data information may be checked by verifying data being programmed at the first word line.

According to example embodiments of inventive concepts, a nonvolatile memory system includes: a nonvolatile memory device including a plurality of memory cells connected to a plurality of word lines and a plurality of bit lines; and a memory controller configured to control the nonvolatile memory device, the memory controller including an ECC decoder configured to correct erroneous bits of first data received from a selected word line of the plurality of word lines, and the ECC decoder being configured to correct the erroneous bits of the first data based on second data received from a non-selected word line of the plurality of word lines, the non-selected word line being adjacent to the selected word line.

Example embodiments of inventive concepts relate to a method of operating a controller configured to control a nonvolatile memory device including a plurality of word lines. The method includes: receiving information associated with a deteriorated page from the nonvolatile memory device; and providing a program command on one word line of the plurality of word lines that is different from an other word line of the plurality of word lines, the other word line corresponding to the deteriorated page.

The one word line of the plurality of word lines may be adjacent to the other word line of the plurality of word lines that corresponds to the deteriorated page.

Example embodiments of inventive concepts relate to a method of programming a nonvolatile memory device which includes a plurality of word lines and a plurality of bit lines. The method includes programming a flag cell with a first pattern, the flag cell being connected to a first bit line; checking whether the flag cell is programmed with the first pattern; programming a dummy memory cell with a second pattern, the dummy memory cell being adjacent to the flag cell, and the dummy memory cell being connected to a second bit line adjacent to the first bit line.

The method may include verifying the dummy memory cell using a verification voltage corresponding to the second pattern.

The programming the flag cell and the programming the dummy memory cell may be done simultaneously.

A common word line may be connected to the flag cell and the dummy memory cell.

The programming of the dummy memory cell with the second pattern may be performed when the programming of the flag cell is passed.

According to example embodiments of inventive concepts, a nonvolatile memory device may include: an array of memory cells including a first memory cell adjacent to a second memory cell; and a control circuit connected to the array of memory cells. The control circuit is configured to detect whether the first memory cell passes or fails a verification operation, and the control circuit is configured to shift a threshold voltage of the first memory cell by supplying a program voltage to the second memory cell when the first memory cell fails the verification operation.

The array of memory cells may include a first word line connected to the first memory cell and a second word line connected to the second memory cell. The first memory cell may be configured to store a first data pattern. The control circuit may be configured to perform the verification operation by providing a verification voltage corresponding to the first data pattern along the first word line to the first memory cell in order to check whether the first memory cell is programmed with the first data pattern. The control circuit may be configured to end supplying the program voltage along the second word line to the second memory cell when the control circuit detects the first memory cell passes the verification operation.

The first data pattern may have an uppermost threshold voltage of a multi-level data pattern.

The array of memory cells may further include a common bit line connected to the first memory cell and the second memory cell.

A nonvolatile memory system may include a memory controller connected to at least one of the foregoing nonvolatile memory devices according to example embodiments.

BRIEF DESCRIPTION OF THE FIGURES

The above and other features will become apparent from the following description on non-limiting embodiments of inventive concepts, as illustrated in the following figures, wherein like reference numerals refer to the same parts throughout the various figures unless otherwise specified. The drawings are not necessarily to scale, emphasis instead being placed upon illustrating the principles of inventive concepts. In the drawings:

FIG. 7 is a timing diagram of a program voltage and a verification voltage applied to a memory cell array in FIG. 6.

DETAILED DESCRIPTION

Figure 1:
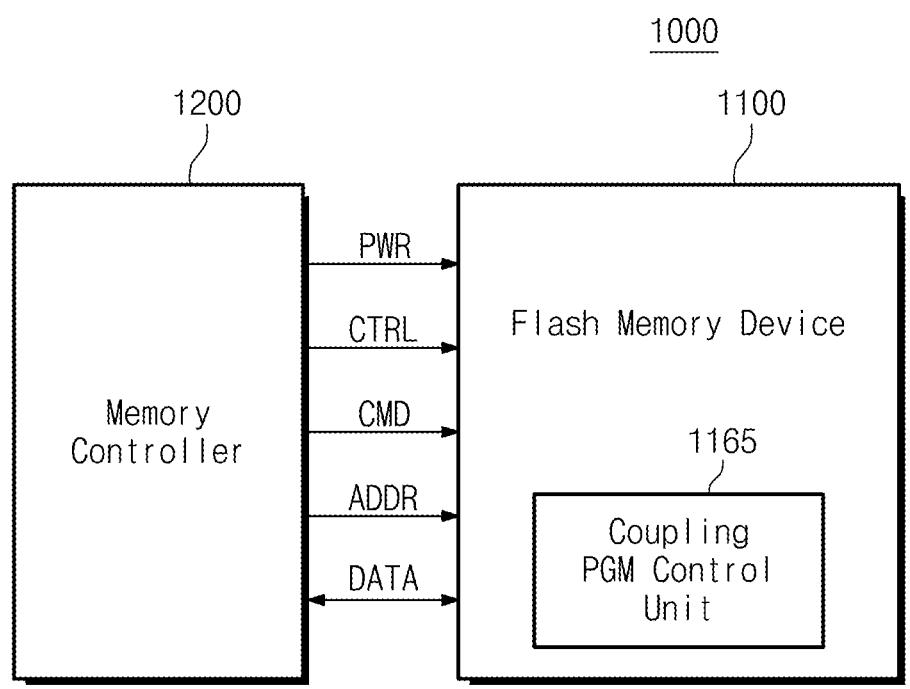
FIG. 1 is a block diagram schematically illustrating a flash memory system according to example embodiments of inventive concepts.

Example embodiments of inventive concepts are described more fully hereinafter with reference to the accompanying drawings, in which some embodiments of inventive concepts are shown. Example embodiments of inventive concepts may, however, be embodied in many different forms and should not be construed as limited to the embodiments set forth herein. Rather, these embodiments are provided so that this disclosure will be thorough and complete, and will fully convey the scope of the example embodiments of inventive concepts to those skilled in the art. In the drawings, the size and relative sizes of layers and regions may be exaggerated for clarity. Like numbers refer to like elements throughout, and thus their description may be omitted.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

FIG. 1 is a block diagram schematically illustrating a flash memory system according to example embodiments of inventive concepts. Referring to FIG. 1, a flash memory system 1000 may include a flash memory device 1100 and a memory controller 1200. The flash memory system 1000 may include flash memory-based data storage mediums such as a memory card, a USB memory, a Solid State Drive (SSD), and the like.

The flash memory device 1100 may perform erase, write, and read operations according to the control of the memory controller 1200. For this, the flash memory device 1100 may receive a command CMD, an address ADDR, and data via input/output lines. The flash memory device 1100 may receive a power PWR via a power line and a control signal CTRL via a control line. The control signal CTRL may include a command latch enable signal CLE, an address latch enable signal ALE, a chip enable signal nCE, a write enable signal nWE, a read enable signal nRE, but example embodiments of inventive concepts are not limited thereto.

The flash memory device 1100 may include a coupling program control unit 1165. The coupling program control unit 1165 may control programming on a selected word line by programming a specific data pattern of the selected word line using a coupling effect of an adjacent cell. The coupling program control unit 1165 can be included within the memory controller 1200. In this case, the coupling program control unit 1165 may be managed by a Flash Translation Layer (FTL).

Figure 2:
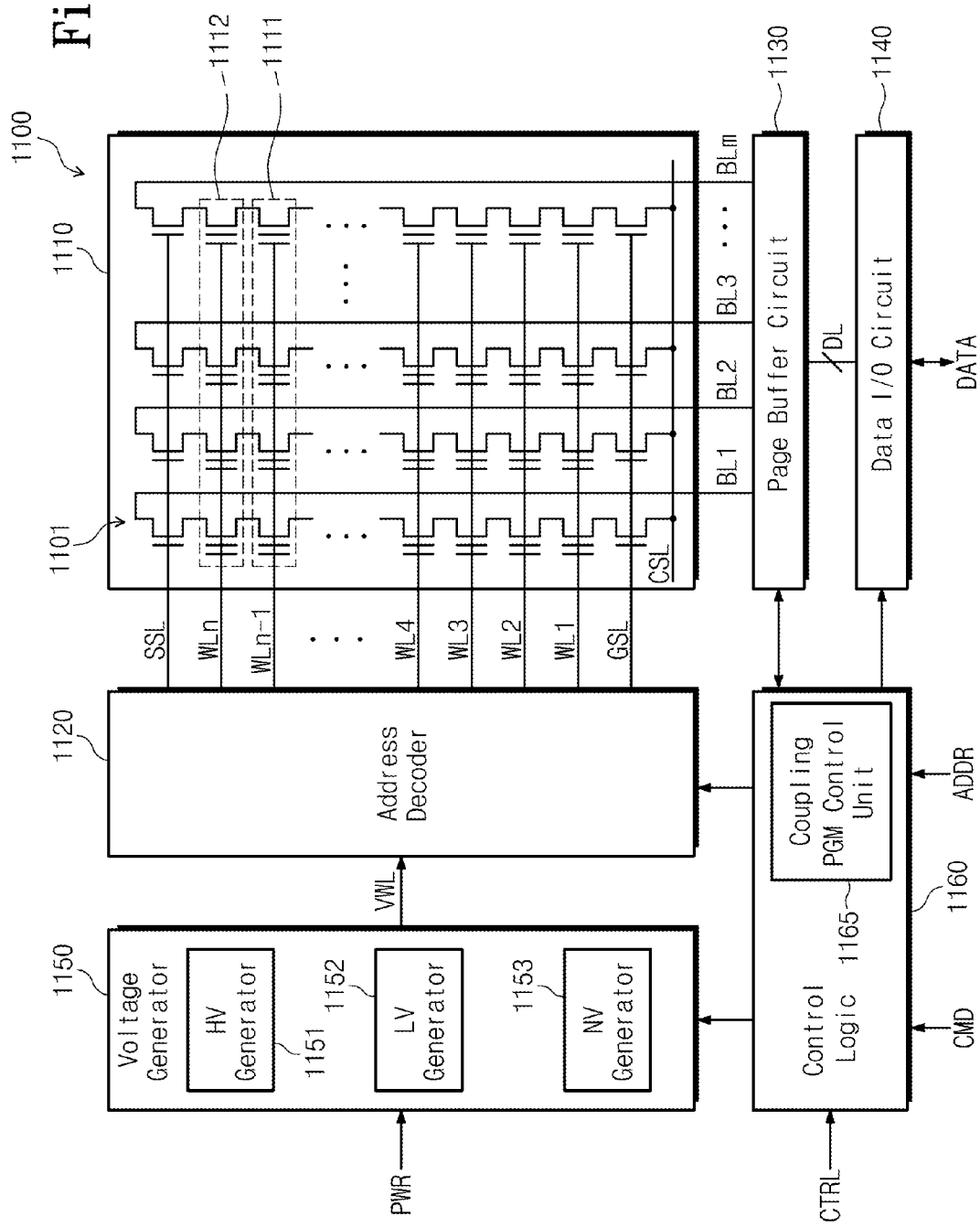
FIG. 2 is a block diagram schematically illustrating a flash memory device in FIG. 1.

FIG. 2 is a block diagram schematically illustrating a flash memory device in FIG. 1. Referring to FIG. 2, a flash memory device 1100 may include a memory cell array 1110, an address decoder 1120, a page buffer circuit 1130, a data input/output circuit 1140, a voltage generator 1150, and control logic 1160.

The memory cell array 1110 may include a plurality of memory blocks. One memory block is illustrated in FIG. 2. Each of the memory blocks may be formed of a plurality of physical pages. Herein, a physical page may mean a set of memory cells connected to a word line. In FIG. 2, a reference numeral '1111' may indicate a physical page. Each physical page may be formed of a plurality of memory cells. Each memory cell may be formed of a cell transistor having a control gate and a floating gate.

A memory cell may store single-bit data or two or more data bits (hereinafter, referred to as multi-bit data). A memory cell capable of storing single-bit data may be referred to as a Single Level Cell (SLC) or a Single Bit Cell (SBC). A memory cell capable of storing multi-bit data may be referred to as a Multi-Level Cell (MLC) or a Multi-Bit Cell (MBC).

In case of a 2-bit MLC flash memory device, two logical pages may be stored at a physical page. Herein, a logical page may mean a group of data which is capable of being programmed at a physical page at the same time. In case of a 3-bit MLC flash memory device, three logical pages may be stored at a physical page.

The memory cell array 1110 may include a plurality of cell strings 1101, each of which has a string selection transistor connected to a string selection line SSL, a plurality of memory cells connected to a plurality of word lines WL1 through WLn, and a ground selection transistor connected to a ground selection line GSL. In each cell string 1101, the string selection transistor may be connected to a bit line, and the ground selection transistor may be connected to a common source line CSL.

The address decoder 1120 may be connected to the memory cell array 1110 via the selection lines SSL and GSL or the word lines WL1 through WLn. At programming or reading, the address decoder 1120 may receive an address ADDR to select one (e.g., WLn−1) (hereinafter, referred to as a selected word line) of the word lines WL1 through WLn.

The page buffer circuit 1130 may be connected to the memory cell array 1110 via bit lines BL1 through BLm. The page buffer circuit 1130 may include a plurality of page buffers (not shown). A page buffer may be connected to a bit line, which is referred to as the all bit line structure. Two or more page buffers may be connected to a bit line, which is referred to as the shield bit line structure. The page buffer circuit 1130 may temporarily store data to be programmed at a selected page 1111 or data read out from the selected page 1111.

The data input/output circuit 1140 may be connected to the page buffer circuit 1130 via data lines DL. Further, the data input/output circuit 1140 may be connected to a memory controller 1200 (refer to FIG. 1) via input/output lines. The data input/output circuit 1140 may receive program data from the memory controller 1200 at reading and provide read data to the memory controller 1200 at reading.

The voltage generator 1150 may receive a power PWR from the memory controller 1200 to generate a word line voltage VWL needed to read or write data. The word line voltage VWL may be provided to the address decoder 1120. Referring to FIG. 2, the voltage generator 1150 may include a high voltage generator 1151, a low voltage generator 1152, and a negative voltage generator 1153.

The high voltage generator 1151 may generate a high voltage higher than a power supply voltage. The high voltage may be used as a program voltage, a pass voltage, and the like. The low voltage generator 1152 may generate a low voltage equal to or lower than the power supply voltage. The power supply voltage or the low voltage may be used as a bit line pre-charge voltage or a CSL voltage. The negative voltage generator 1153 may generate a negative voltage lower than 0V. The negative voltage may be used to a program verification voltage and the like.

The control logic 1160 may control operations (e.g., programming, reading, erasing, etc.) of the flash memory device 1100 using the command CMD, the address ADDR, and the control signal CTRL. For example, at programming, the control logic 1160 may control the address decoder 1120 to provide a program voltage to the selected word line (e.g., WLn−1) and the page buffer circuit 1130 and the data input/output circuit 1140 to provide program data to the selected page 1111.

The control logic 1160 may include a coupling program control unit 1165. The coupling program control unit 1165 may control a program operation on a page 1112 adjacent to the selected page 1111 at a program operation. This will be more fully described later.

Figure 3:
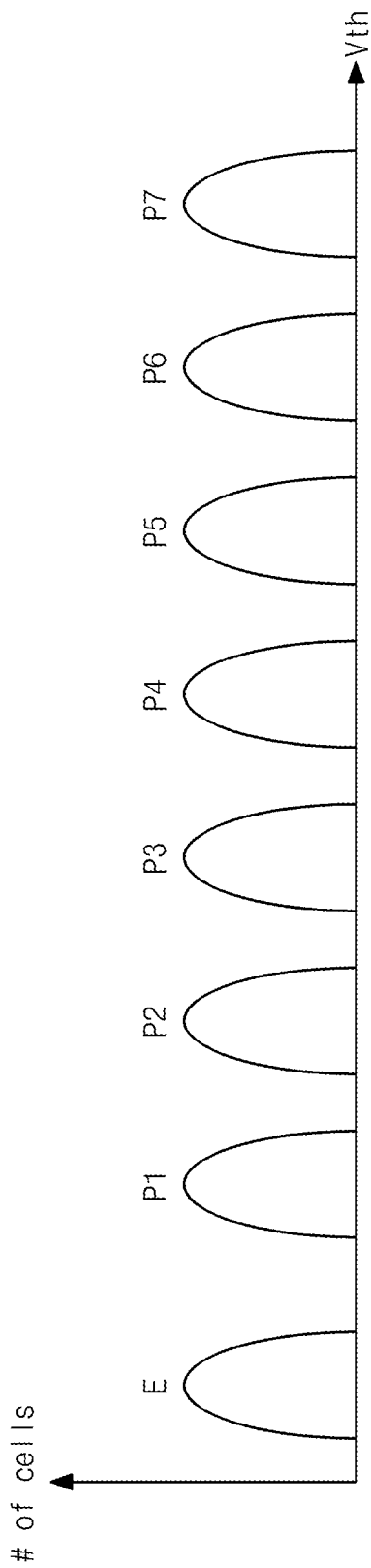
FIG. 3 is a diagram illustrating a program state of a 3-bit MLC flash memory device.

FIG. 3 is a diagram illustrating a program state of a 3-bit MLC flash memory device. As illustrated in FIG. 3, a 3-bit MLC may have one of an erase state E and seven program states P1 through P7.

For a flash memory device, as a time elapses, electrons trapped at a floating gate or a tunnel oxide may be discharged. This may be named charge loss. A tunnel oxide may be deteriorated at iteration of programming and erasing, so that the charge loss may increase. A threshold voltage of a memory cell may be lowered due to the charge loss. This may make a threshold voltage distribution shifted to the left. A threshold voltage of a memory cell may increase due to program disturbance or back pattern dependency. Thus, the deterioration of cell characteristics may make threshold voltage distributions overlapped one another. In this case, an error may be included within data read when a specific read voltage is applied to a selected word line.

According to example embodiments of inventive concepts, a variation in a threshold voltage distribution may be reduced by removing or reducing the program disturbance. This may mean that a read error is reduced.

Figure 4:
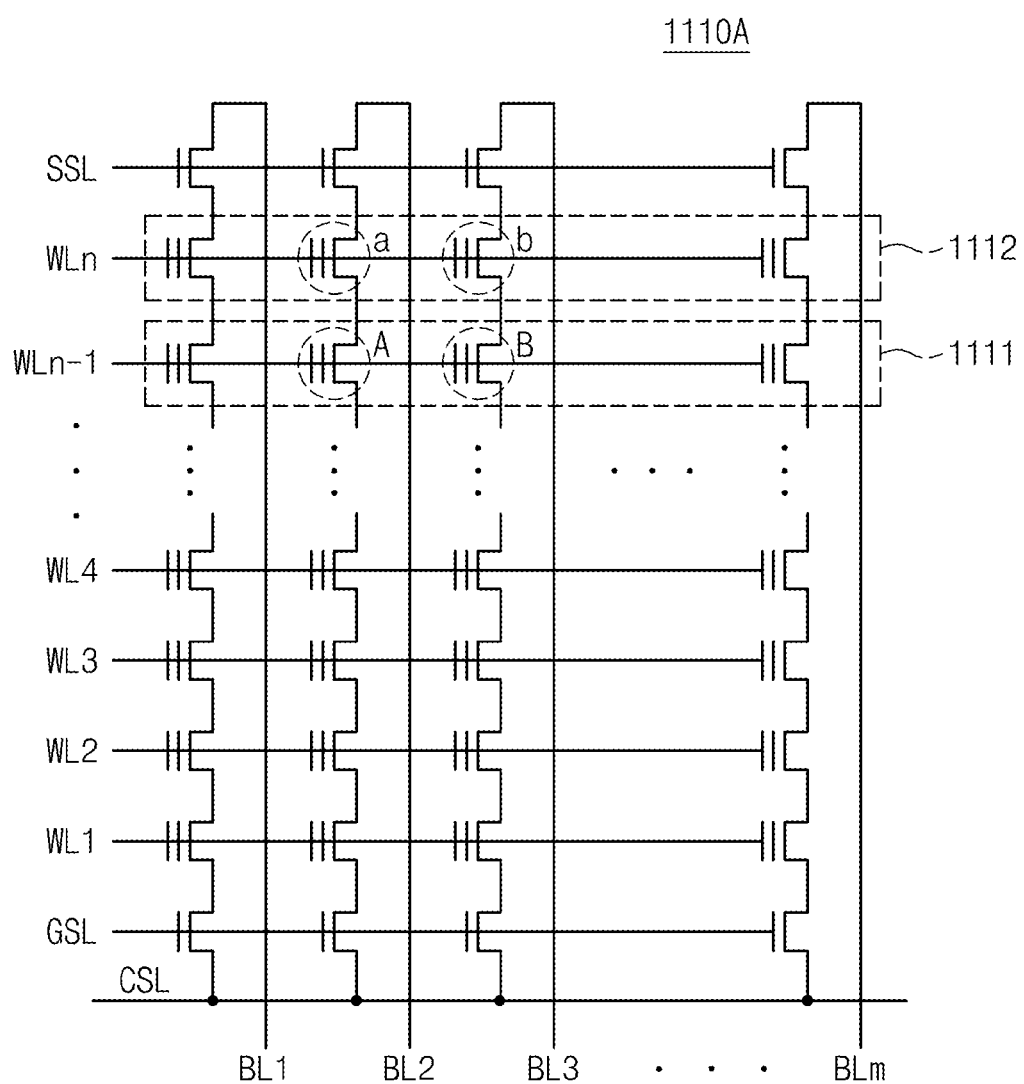
FIG. 4 is a circuit diagram partially illustrating a memory cell array according to example embodiments of inventive concepts.

FIG. 4 is a circuit diagram partially illustrating a memory cell array according to example embodiments of inventive concepts. FIG. 4 illustrates a part 1110A of a memory cell array 1110.

Referring to FIG. 4, a block of the memory cell array 1110 may include n word lines. A selected page 1111 may include first memory cells A and B in which a first data pattern provided from a memory controller 1200 may be stored, and an adjacent page 1112 may include second memory cells a and b supplied with a program voltage according to information of the first data pattern.

According to the control of a coupling program control unit 1165 (refer to FIG. 2), a flash memory device 1100 (refer to FIG. 2) may program the second memory cells a and b using a program voltage from a high voltage generator 1151 (refer to FIG. 2) and verify the first data pattern of the first memory cells A and B using a verification voltage corresponding to the first data pattern.

The coupling program control unit 1165 may program the second memory cells a and b using the program voltage until a verification operation on the first memory cells A and B passes. When a verification operation on the first memory cells A and B passes, programming of the second memory cells a and b may end. The first data pattern may be a data pattern having the uppermost threshold voltage of a multi-level data pattern. For example, the first data pattern may have a program state P7.

The coupling program control unit 1165 may control a program operation on the second memory cells a and b. The coupling program control unit 1165 may provide a program voltage to the second memory cells a and b according to the first data pattern and program states of the first memory cells A and B.

The coupling program control unit 1165 may verify programming on the first data pattern of the first memory cells A and B using a verification voltage corresponding to the first data pattern. The coupling program control unit 1165 may control programming on the second memory cells a and b when a verification operation of the first data pattern fails.

Further, the coupling program control unit 1165 may program the second memory cells a and b when a loop of a program voltage being applied to the first memory cells A and B is over a given reference loop. The coupling program control unit 1165 may control programming of the second memory cells a and b if the number of fail bits of the first memory cells A and B connected to a selected word line WLn−1 is over a specific reference value.

While FIG. 4 illustrates the case where the first and second memory cells A and B are connected to word line WLn−1, example embodiments of inventive concepts are not limited thereto. For example, the first and second memory cells A and B can be connected to a lower word line (e.g., WL2).

The second memory cells a and b may be connected to a dummy word line 1112 adjacent to the first memory cells A and B. Herein, the dummy word line may be a word line where a data pattern provided from the memory controller 1200 is not stored. The dummy word line 1112 can be placed to be adjacent to each of a string selection line SSL and a ground selection line GSL.

According to example embodiments of inventive concepts, a flash memory device may include a word line WLn−1 connected to the first memory cells A and B and a page buffer circuit 1130 storing first data pattern information being stored at the first memory cells A and B. Further, the flash memory device may include a word line WLn being supplied with a program voltage according to the first data pattern information. The coupling program control unit 1165 may provide a program voltage to the word line WLn.

A voltage generator 1150 may provide the word line WLn−1 with a verification voltage corresponding to the first data pattern. The word line WLn−1 may be an uppermost or lowermost word line of a memory block in the memory cell array 1110, and the word line WLn may be a dummy word line adjacent to the word line WLn−1. The dummy word line may be a word line that does not have a data pattern input from the memory controller 1200. The dummy word line can be placed to be adjacent to each of a string selection line and a ground selection line.

The page buffer circuit 1130 may check a pass or fail of a data pattern of the selected word line WLn−1 according to a verification voltage provided to the selected word line WLn−1. The coupling program control unit 1165 may again provide a program voltage to the dummy word line WLn when a verification operation on the selected word line WLn−1 is failed.

Figure 5:
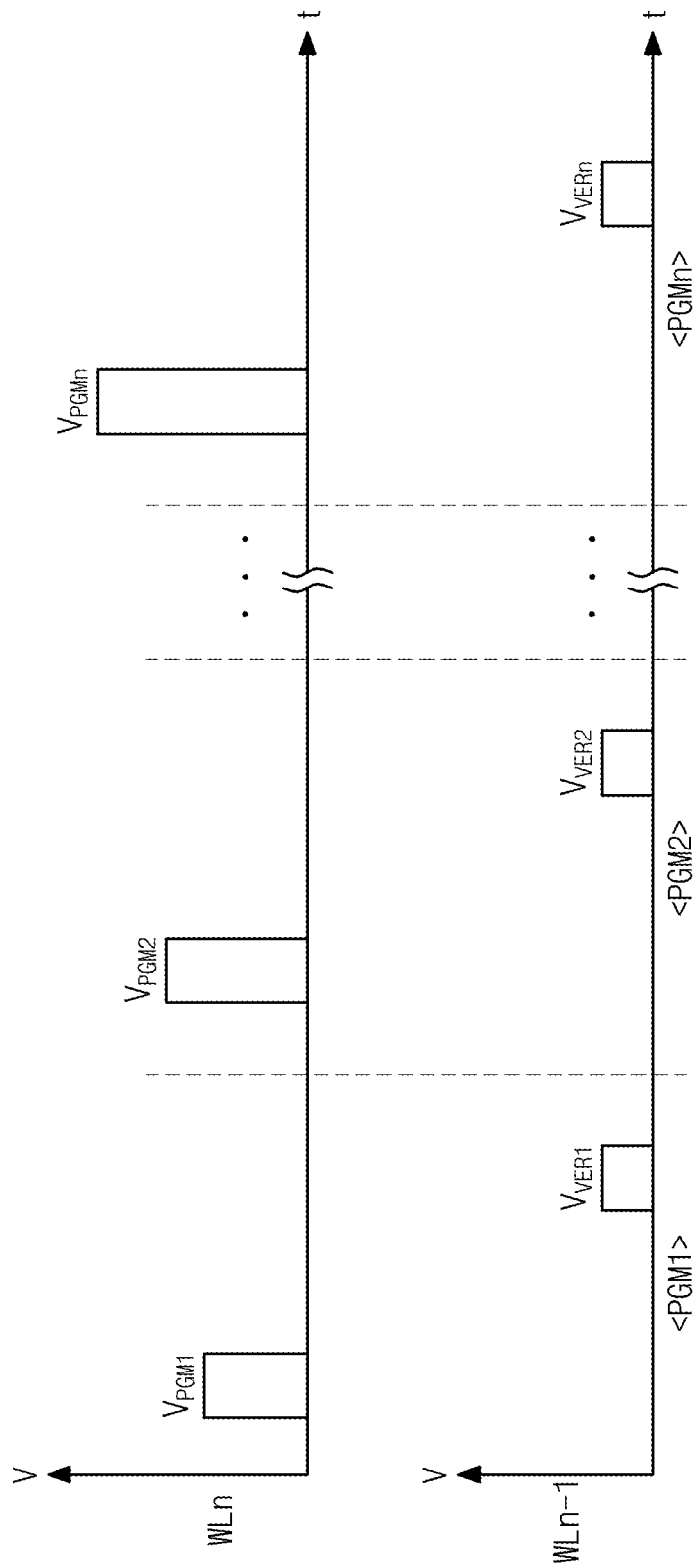
FIG. 5 is a timing diagram of a program voltage and a verification voltage applied to a memory cell array in FIG. 4.

FIG. 5 is a timing diagram of a program voltage and a verification voltage applied to a memory cell array in FIG. 4. In FIG. 5, a horizontal axis may indicate a time, and a vertical axis may indicate a voltage being supplied to a selected word line WLn−1 and a dummy word line WLn.

Referring to FIG. 5, during a first program period PGM1, a first program voltage VPGM1 may be provided to a dummy word line WLn connected with second memory cells a and b under the control of a coupling program control unit 1165.

A first verification voltage VVER1 may be provided to a selected word line WLn−1 which is connected with first memory cells A and B and is adjacent to the dummy word line WLn. If the verification voltage is applied to the selected word line WLn−1, a page buffer circuit 1130 may verify data programmed at the selected word line WLn−1. The coupling program control unit 1165 may again provide the program voltage to the dummy word line WLn until a verification result of the page buffer circuit 1130 indicates a pass.

Continuing to refer to FIG. 5, during a second program period PGM2, a second program voltage VPGM2 may be provided to the dummy word line WLn connected with the second memory cells a and b under the control of the coupling program control unit 1165. The second program voltage VPGM2 may be higher than the first program voltage VPGM1.

A second verification voltage VVER2 may be provided to the selected word line WLn−1 which is connected with the first memory cells A and B and is adjacent to the dummy word line WLn. If the verification voltage is applied to the selected word line WLn−1, the page buffer circuit 1130 may verify whether data is programmed at the selected word line WLn−1. The coupling program control unit 1165 may again provide the program voltage to the dummy word line WLn until a verification result of the page buffer circuit 1130 indicates a pass. The coupling program control unit 1165 may control the dummy word line WLn so as to be iteratively programmed until an nth program period.

Figure 6:
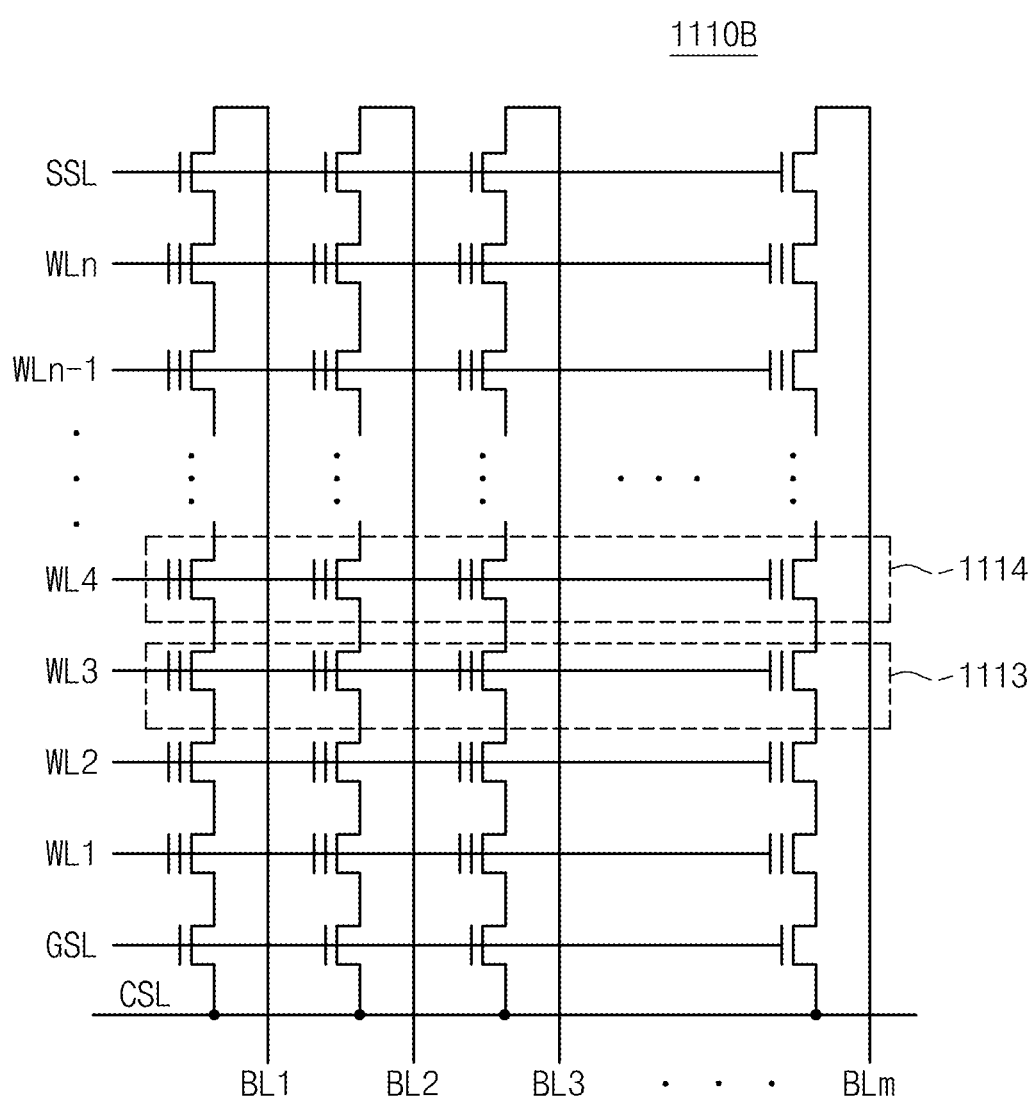
FIG. 6 is a circuit diagram partially illustrating a memory cell array according to example embodiments of inventive concepts.

FIG. 6 is a circuit diagram partially illustrating a memory cell array according to example embodiments of inventive concepts. FIG. 6 illustrates a part 1110B of a memory cell array 1110. FIG. 6 shows the case that a selected word line and a dummy word line are placed at a center (e.g., WL3 and WL4) of a memory block.

Referring to FIG. 6, a memory cell array may include a selected word line (WL3) 1113, in which a first data pattern input from a memory controller 1200 (refer to FIG. 1) is to be programmed, and a dummy word line (WL4) 1114 adjacent to the selected word line 1113. A coupling program control unit 1165 may confirm information of the first data pattern being programmed at the selected word line WL3.

The coupling program control unit 1165 may apply a first program voltage VPGM1 to the dummy word line 1114 based on the confirmed data information. The coupling program control unit 1165 may control programming of the dummy word line WL4. The coupling program control unit 1165 may provide a program voltage to the dummy word line 1114 according to the first data pattern and a program state of the selected word line WL3.

FIG. 7 is a timing diagram of a program voltage and a verification voltage applied to a memory cell array in FIG. 6. In FIG. 6, a horizontal axis may indicate a time, and a vertical axis may indicate a voltage being supplied to a selected word line WLn−1 and a dummy word line WLn.

A coupling program control unit 1165 may check first data information programmed at a selected word line WL3. If the first data information indicates a program state P7, the coupling program control unit 1165 may provide a first program voltage VPGM1 to a dummy word line WL4 during a first program period PGM1.

A first verification voltage VVER1 may be provided to the selected word line WL3 adjacent to the dummy word line WL4. If the verification voltage is applied to the selected word line WL3, the page buffer circuit 1130 may verify whether first data information is programmed at the selected word line WL3. The coupling program control unit 1165 may again provide the program voltage to the dummy word line WL4 until verification is passed.

Continuing to refer to FIG. 7, during a second program period PGM2, a second program voltage VPGM2 may be provided to the dummy word line WL4 under the control of the coupling program control unit 1165. The second program voltage VPGM2 may be higher than the first program voltage VPGM1.

A second verification voltage VVER2 may be provided to the selected word line WL3 adjacent to the dummy word line WL4. If the verification voltage is applied to the selected word line WL3, a page buffer circuit 1130 may verify whether first data information is programmed at the selected word line WL3. The coupling program control unit 1165 may again provide the program voltage to the dummy word line WL4 until verification is passed. The coupling program control unit 1165 may control the dummy word line WL4 so as to be iteratively programmed until an nth program period.

Figure 8A:
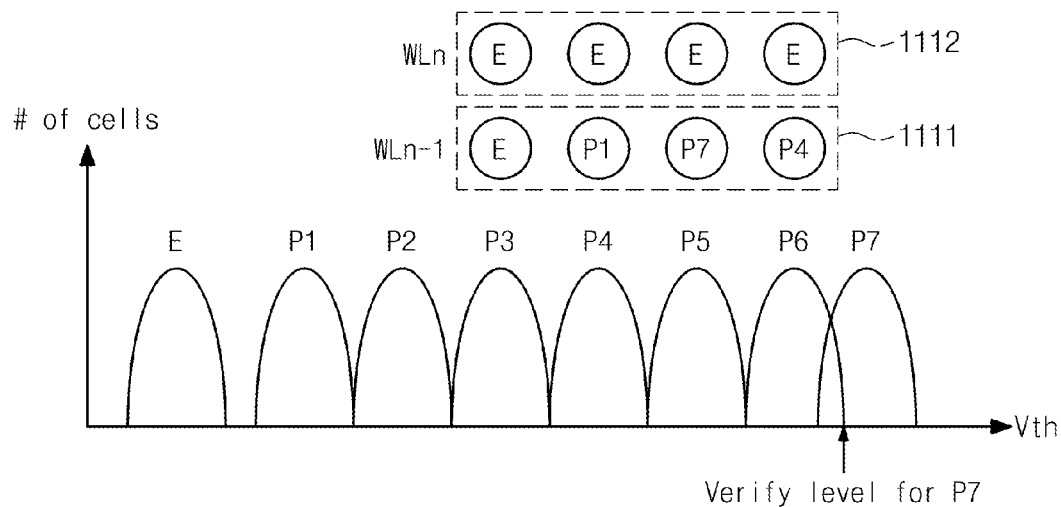
FIGS. 8A and 8B are diagrams describing an operation of programming a dummy word line adjacent to a selection word line according to example embodiments of inventive concepts.
Figure 8B:
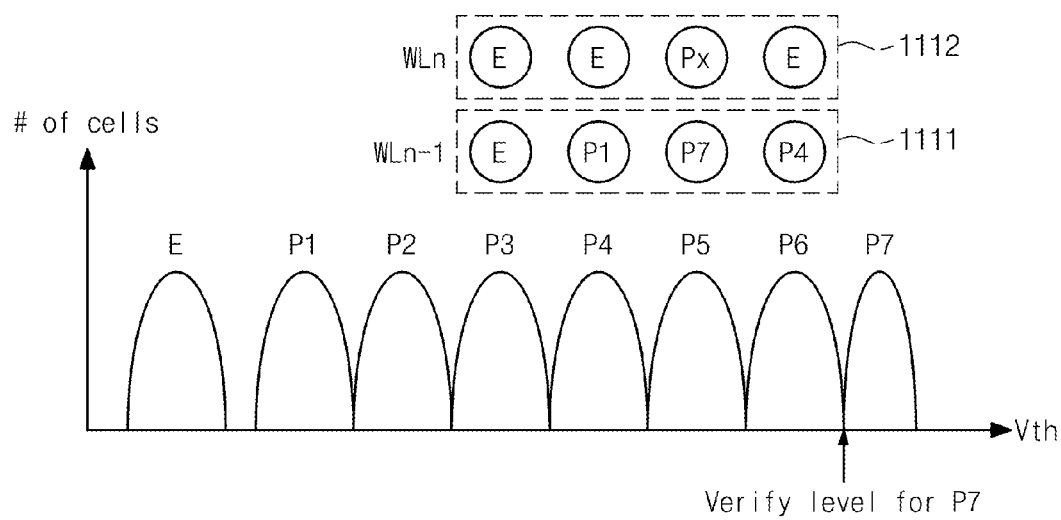

FIGS. 8A and 8B are diagrams describing an operation of programming a dummy word line adjacent to a selection word line according to example embodiments of inventive concepts. In FIGS. 8A and 8B, there may be illustrated threshold voltage distributions of a 3-bit MLC flash memory device illustrated in FIG. 3. A program state or an MLC data pattern of a flash memory device may be decided according to a magnitude of a threshold voltage. In FIGS. 8A and 8B, there may be illustrated the case that a state P7 is a data pattern having a highest threshold voltage in a 3-bit flash memory device.

Referring to FIG. 8A, a selected word line 1111 may be a word line in which data provided from a memory controller 1200 (refer to FIG. 1) is being programmed, and a dummy word line 1112 may be a word line which has an erase state and data provided from the memory controller 1200 is not programmed in.

Since the data pattern P7 has a highest threshold voltage, a highest program voltage Vpgm may be required to form the data pattern P7. A threshold voltage of an erase cell may increase due to program disturbance generated by a high program voltage. Thus, the reliability of a flash memory device may be lowered.

Referring to FIG. 8A, memory cells each having a threshold voltage lower than a verification voltage corresponding to the P7 data pattern may exist. That is, the selected word line WLn−1 may include memory cells of the P7 data pattern that don't experience program completion. It is possible to check memory cells of the selected word line WLn−1 not experiencing program completion using a verification voltage corresponding to the P7 data pattern.

Referring to FIG. 8B, a coupling program control unit 1165 may program a memory cell adjacent to a verify-failed memory cell of the P7 data pattern. In other words, the coupling program control unit 1165 may selectively program a memory cell Px, adjacent to the verify-failed memory cell of the P7 data pattern connected to the selected word line WLn−1, from among memory cells included in the dummy word line WLn.

As a memory cell of the dummy word line WLn is programmed, a threshold voltage of a memory cells, not programmed, of the selected word line WLn−1 may increase due to a coupling effect of the adjacent cell. Thus, a verification operation may be passed when the selected word line WLn−1 is verified using a verification voltage corresponding to the P7 data pattern.

Referring to FIG. 8B, no memory cells each having a threshold voltage lower than a verification voltage corresponding to the P7 data pattern may exist. Further, to complete programming of the selected word line WLn−1 using a coupling effect of an adjacent cell generated at programming of a dummy word line WLn may make it possible to limit (and/or prevent) a threshold voltage of an erase cell in the selected word line from increasing due to program disturbance.

Figure 9:
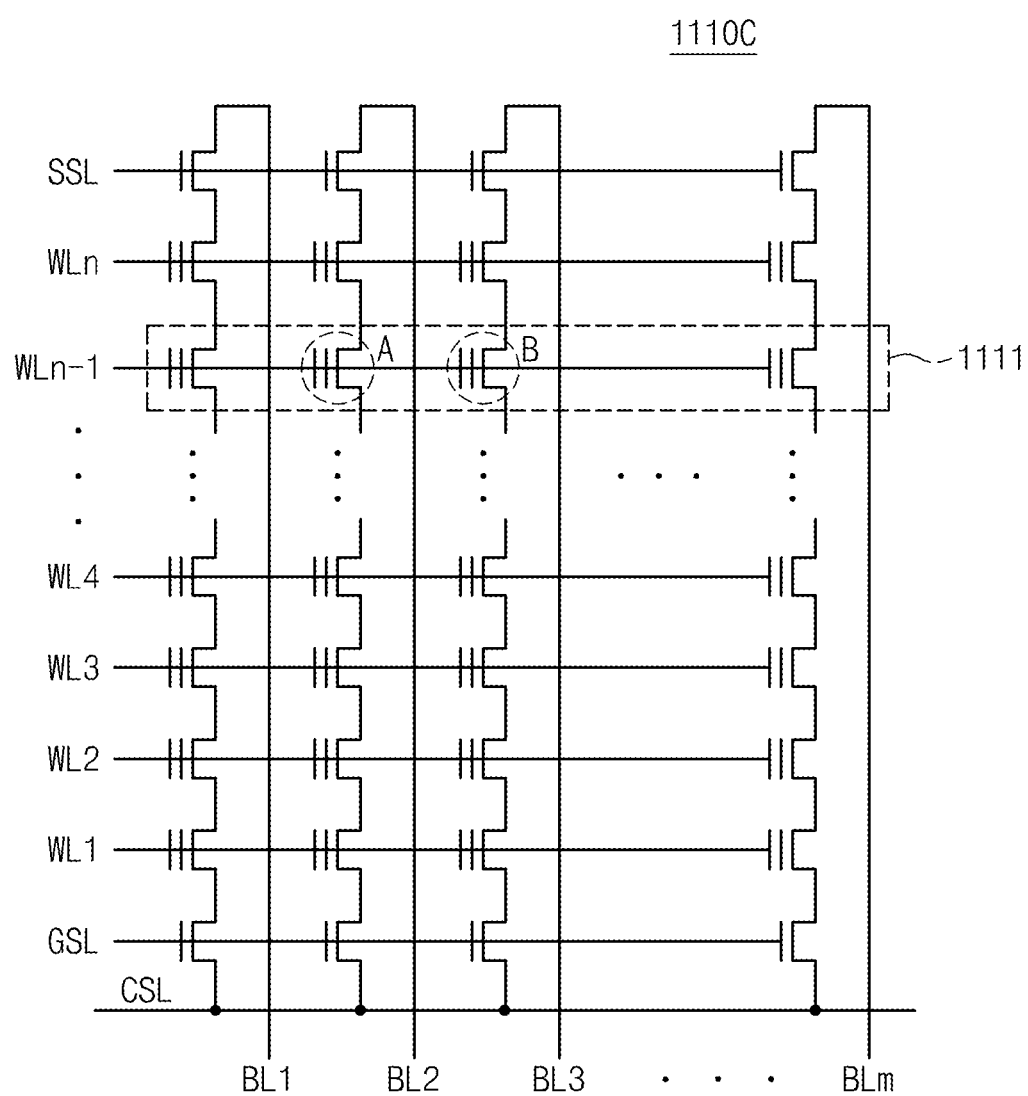
FIG. 9 is a circuit diagram partially illustrating a memory cell array according to example embodiments of inventive concepts.

FIG. 9 is a circuit diagram partially illustrating a memory cell array according to example embodiments of inventive concepts.

Referring to FIG. 9, a selection memory cell A storing data indicative of property information may be connected to a second bit line BL2. A dummy memory cell B may be connected to a third bit line BL3. Herein, data indicative of property information may not be stored in the dummy memory cell B. The selection memory cell A and the dummy memory cell B may be connected to the same word line WLn−1.

A coupling program control unit 1165 (refer to FIG. 2) may program the selection memory cell A connected to the second bit line BL2 with a first pattern, check whether the first pattern is programmed, and program the dummy memory cells B connected to the third bit line BL3 adjacent to the second bit line BL2 with a second pattern. The coupling program control unit 1165 may program the dummy memory cell B with the second pattern when programming on the selection memory cell A is passed. The coupling program control unit 1165 may verify the dummy memory cell B using a verification voltage corresponding to the second pattern.

The selection memory cell A may be a flag cell, and may include information indicating a program state of memory cells. The dummy memory cell B and the flag cell A may be simultaneously programmed under the control of the coupling program control unit 1165. This will be more fully described with reference to FIG. 11.

Figure 10:
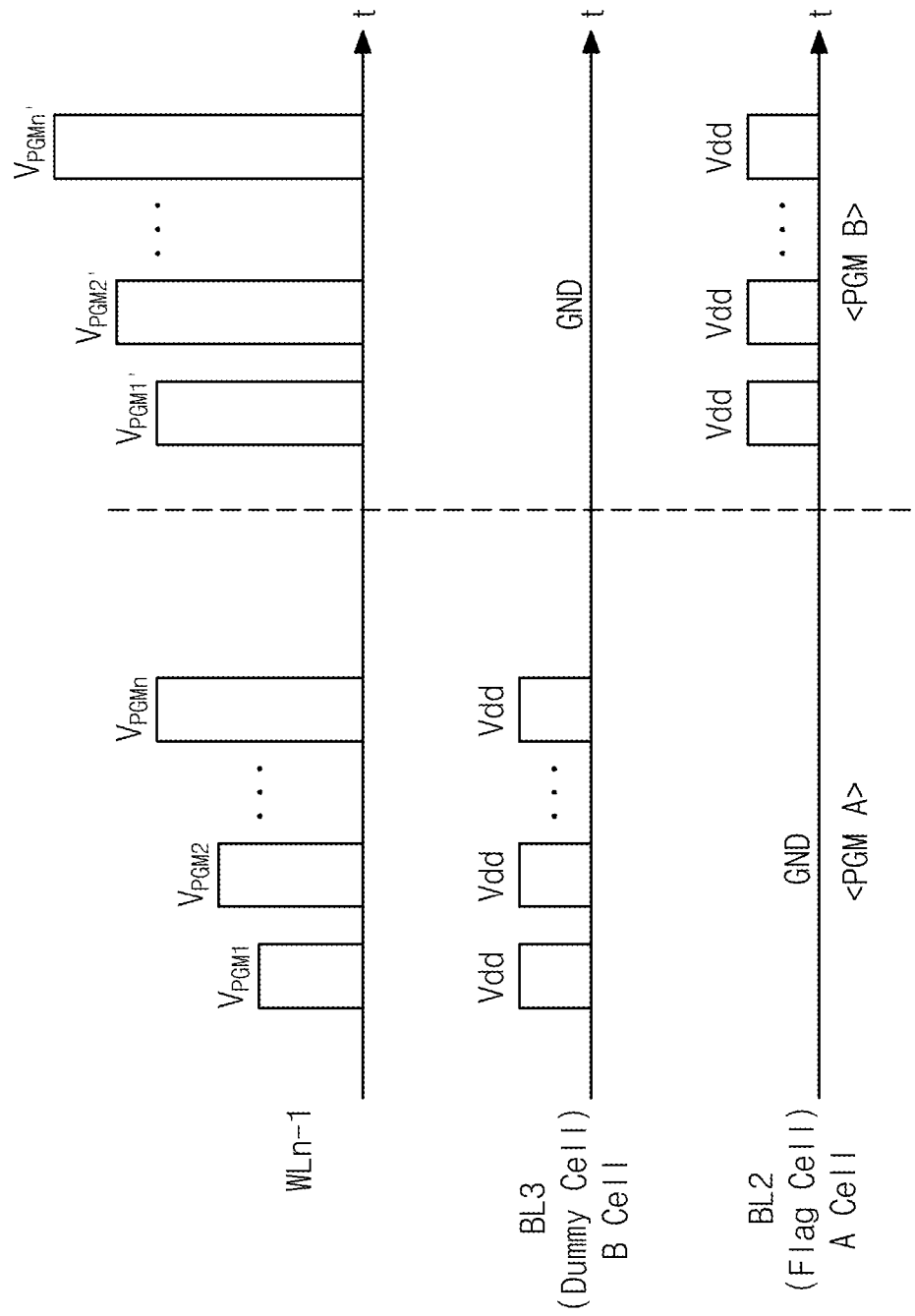
FIG. 10 is a timing diagram of a program voltage applied to a memory cell array in FIG. 9.

FIG. 10 is a timing diagram of a program voltage applied to a memory cell array in FIG. 9. In FIG. 10, a horizontal axis may indicate a time, and a vertical axis may indicate a voltage being supplied to a second bit line, a third bit line, and a selected word line WLn−1.

Referring to FIG. 10, during a program period PGM A, program voltages VPGM1 through VPMGn may be provided to a word line WLn−1 connected with a flag cell A and a dummy memory cell B under the control of the coupling program control unit 1165. A power supply voltage Vdd may be supplied to a bit line BL3 connected to the dummy memory cell B such that the dummy memory cell B is program inhibited. A ground voltage may be provided to a bit line BL2 connected to the flag cell A such that the flag cell A is programmed with a first pattern.

During a program period PGM B, program voltages VPGM1' through VPGMn' higher by a desired (or alternatively predetermined) level than the program voltages VPGM1 through VPGMn may be provided to the selected word line WLn−1 connected with the dummy memory cell B. A ground voltage may be provided to the bit line BL3 connected to the dummy memory cell B such that the dummy memory cell B is programmed with a second pattern. A power supply voltage Vdd may be applied to the bit line BL2 connected to the flag cell A such that the flag cell A is not programmed during a period where a program voltage is applied to the word line WLn−1.

Figure 11:
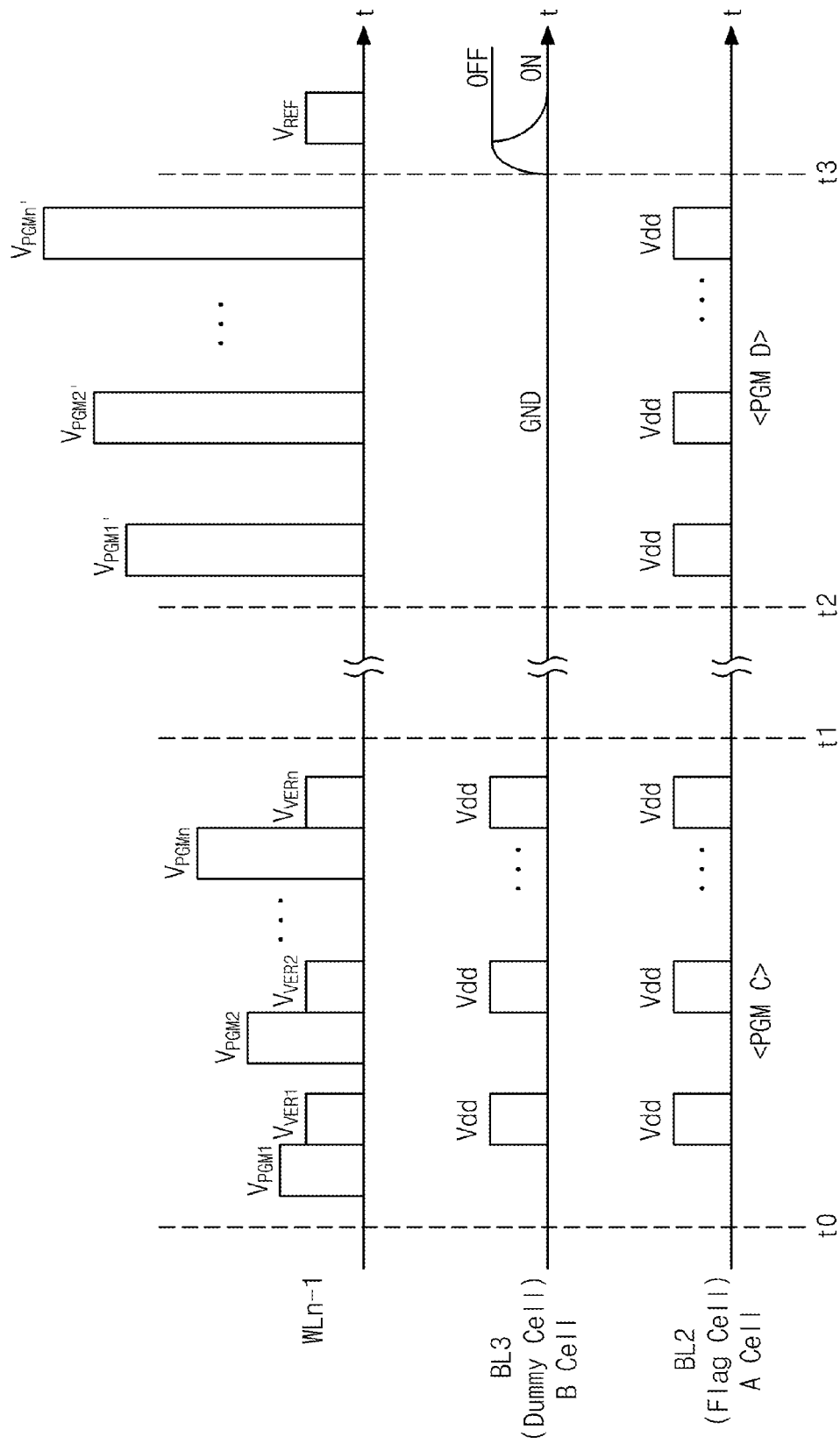
FIG. 11 is a timing diagram of a program voltage and a verification voltage applied to a memory cell array in FIG. 9.

FIG. 11 is a timing diagram of a program voltage and a verification voltage applied to a memory cell array in FIG. 9.

Referring to FIG. 11, during a program period PGM C, program voltages VPGM1 through VPMGn may be provided to a word line WLn−1 connected with a flag cell A and a dummy memory cell B under the control of the coupling program control unit 1165.

In the program period PGM C (t0 through t1), while the program voltages VPGM1 through VPMGn are provided to the word line WLn−1, a ground voltage may be applied to a bit line BL2 connected to the flag cell A and a bit line BL3 connected to the dummy memory cell B. Thus, the flag cell A and the dummy cell B may be programmed. Whenever the program voltages VPGM1 through VPMGn are provided, verification voltages VVER1 through VVERn corresponding to the first pattern may be provided to a word line. At this time, a power supply voltage Vdd may be applied to the bit lines BL2 and BL3.

During a program period PGM D (t2 through t3), program voltages VPGM1' through VPGMn' higher by a desired (or alternatively predetermined) level than the program voltages VPGM1 through VPGMn may be provided to the word line WLn−1 connected with the flag cell A and the dummy memory cell B. During the program period PGM D, the power supply voltage Vdd may be applied to the bit line BL2 connected with the flag cell A, and the ground voltage may be supplied to the bit line BL3 connected to the dummy memory cell B. Thus, the flag cell A may not be programmed any more, while the dummy memory cell B may be programmed.

A given program voltage loop number may be applied to the dummy memory cell B, and then the dummy memory cell B may be verified using a verification voltage corresponding to the second pattern.

Figure 12:
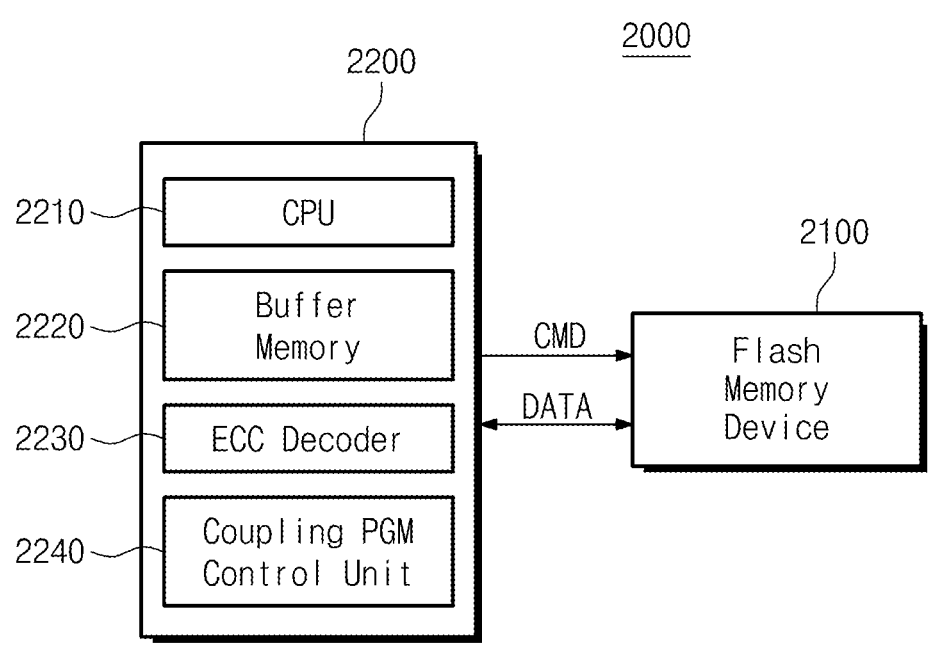
FIG. 12 is a block diagram schematically illustrating a nonvolatile memory system according to example embodiments of inventive concepts.

FIG. 12 is a block diagram schematically illustrating a nonvolatile memory system according to example embodiments of inventive concepts. Referring to FIG. 12, a nonvolatile memory system 2000 may include a memory controller 2200 and a flash memory device 2100.

The memory controller 2200 may control the nonvolatile memory system 2000 overall. The flash memory device 2100 may program data provided from the memory controller 2200 according to the control of the memory controller 2200. According to the control of the memory controller 2200, the flash memory device 2100 may read programmed data to provide it to the memory controller 2200. The flash memory device 2100 may include a plurality of memory cells connected to a plurality of word lines and a plurality of bit lines.

The memory controller 2200 may include a CPU 2210, a buffer memory 2200, an ECC decoder 2230, and a coupling program control unit 2240.

The CPU 2210 may control an overall operation of the memory controller 2200. The CPU 2210 may decode a command provided from a host (not shown) to control an overall operation of the flash memory device 2100.

The buffer memory 2220 may store data used to control an overall operation of the nonvolatile memory system 2000. The buffer memory 2220 may store data to be programmed at the flash memory device 2100 or data read out from the flash memory device 2100.

The ECC decoder 2230 may detect and correct an error of data read from the flash memory device 2100. The ECC decoder 2230 may include all of a circuit for error correction, a system for error correction, and a device for error correction.

The coupling program control unit 2240 may control programming of a specific data pattern of a selected word line of the flash memory device 2100 using a coupling effect of an adjacent cell. The coupling program control unit 2240 may be managed by a flash translation layer (FTL).

When correcting erroneous bits of first data received from the selected word line, the ECC decoder 2230 may make error correction on the first data based on second data received from a dummy word line adjacent to the selected word line.

The coupling program control unit 2240 may be provided with information of a deteriorated page from the flash memory device 2100, and may provide a program command on a word line different from a word line of the deteriorated page based on the received information on the deteriorated page. For example, the coupling program control unit 2240 may provide a program command on a word line adjacent to a deteriorated word line.

Figure 13:
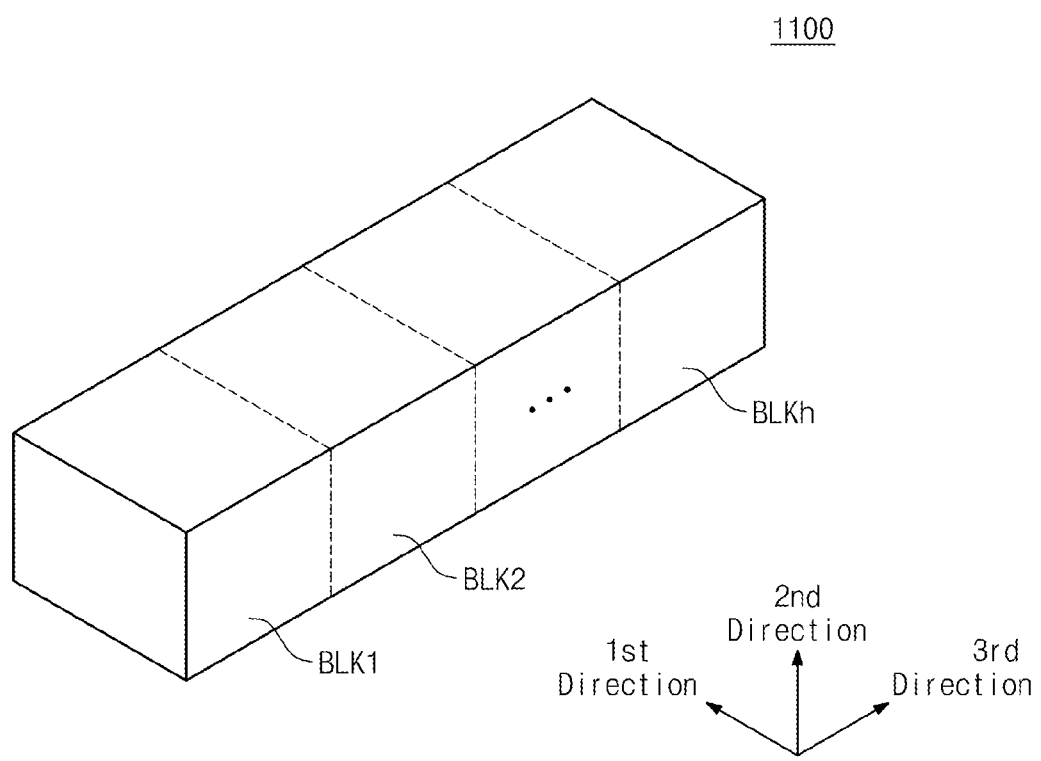
FIG. 13 is a diagram schematically illustrating a memory cell array in FIG. 2 according to example embodiments of inventive concepts.

As shown in FIGS. 13 to 17, a flash memory device according to example embodiments may have a three-dimensional structure. FIG. 13 is a diagram schematically illustrating a memory cell array in FIG. 2 according to example embodiments of inventive concepts. Referring to FIG. 13, a memory cell array 1100 may include a plurality of memory blocks BLK1 through BLKh, each of which is formed to have a three-dimensional structure (or, a vertical structure). For example, each of the memory blocks BLK1 through BLKh may include structures extending along first to third directions.

Although not shown in FIG. 13, each of the memory blocks BLK1 through BLKh may include a plurality of NAND strings extending along the second direction. For example, a plurality of NAND strings NS may be provided along the first and third directions. Each NAND string NS may be connected to a bit line, at least one string selection line, at least one ground selection line, word lines, at least one dummy word line, and a common source line. That is, each memory block may be connected to a plurality of bit lines, a plurality of string selection lines, a plurality of ground selection lines, a plurality of dummy word lines, and a plurality of common source lines. Each memory block will be more fully described with reference to FIG. 14.

Figure 14:
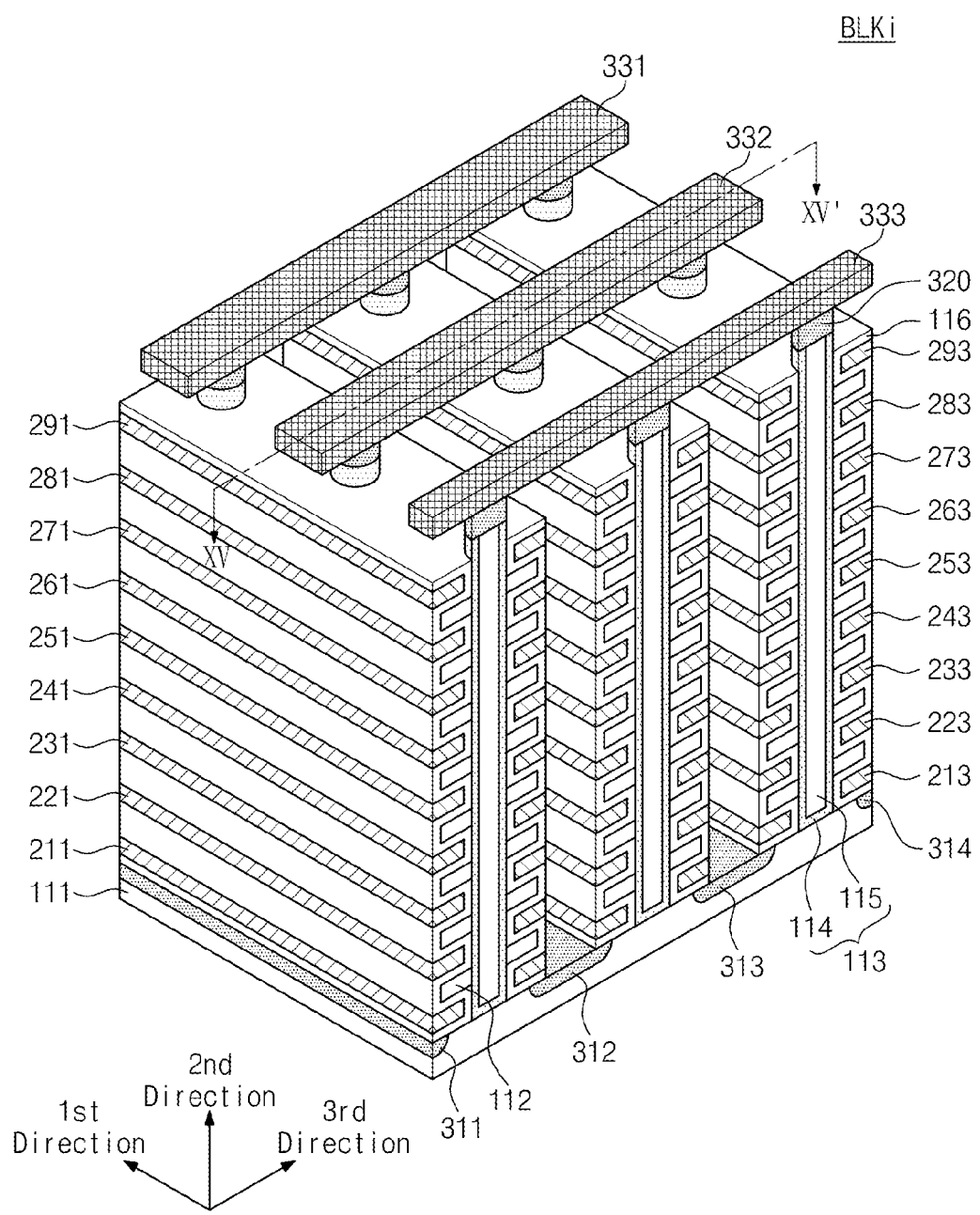
FIG. 14 is a perspective view of a part of a memory block in FIG. 13 according to example embodiments of inventive concepts.
Figure 15:
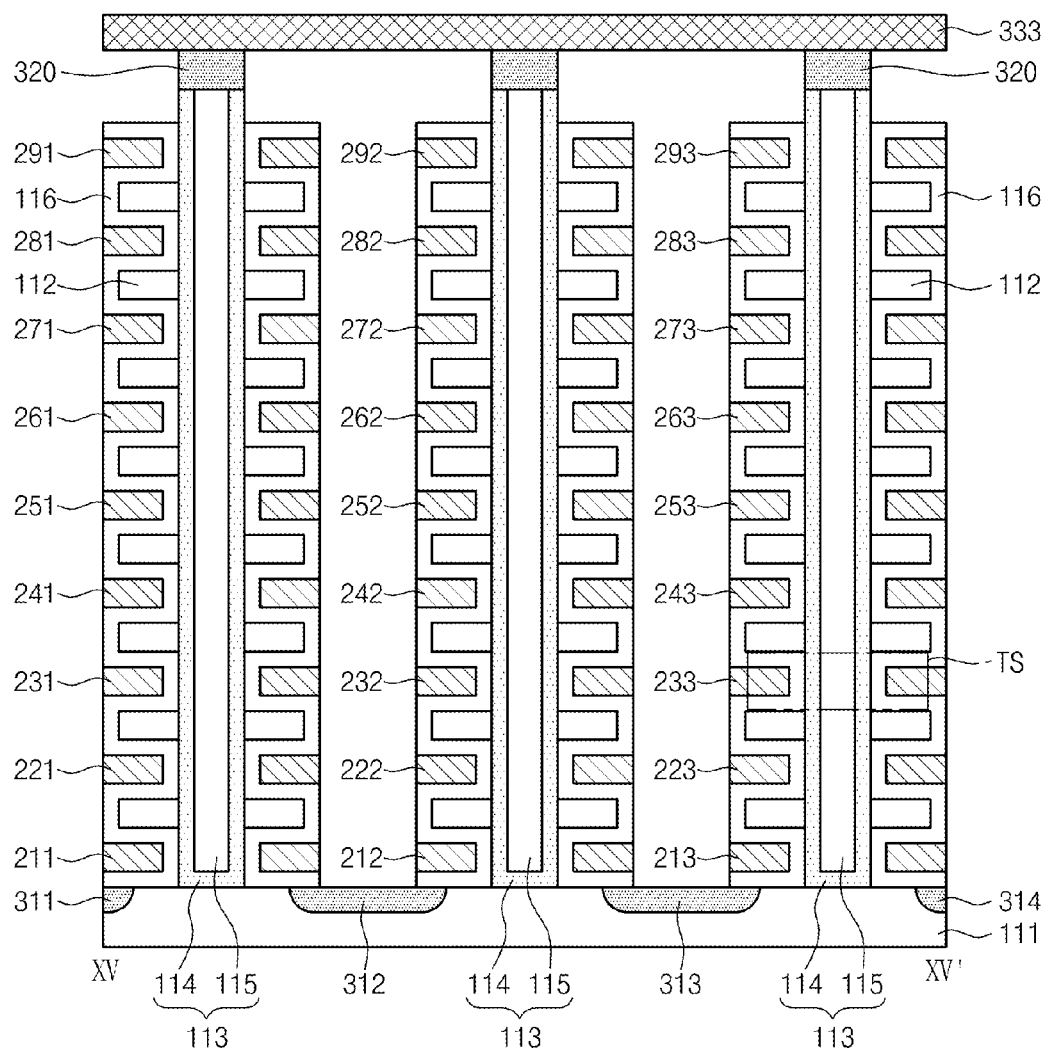
FIG. 15 is a cross-sectional view taken along a line XV-XV' of FIG. 14.

FIG. 14 is a perspective view of a part of a memory block in FIG. 13 according to example embodiments of inventive concepts, and FIG. 15 is a cross-sectional view taken along a line XV-XV' of FIG. 14. Referring to FIGS. 14 and 15, a memory block BLKi may include structures that extend along first to third directions.

First, a substrate 111 may be provided. In example embodiments, the substrate 111 may include a silicon material doped with a first-type impurity. For example, the substrate 111 may be a silicon material doped with a p-type impurity or a p-well (or, a pocket p-well), and may further include an n-well surrounding the p-well. Below, it is assumed that the substrate 111 is p-type silicon. However, the substrate 111 is not limited thereto.

A plurality of doping regions 311 through 314 extending along the first direction may be provided at the substrate 111. For example, a plurality of doping regions 311 through 314 (hereinafter, referred to first through fourth doping regions) may be an n-type. Hereinafter, it is assumed that the first through fourth doping regions 311 through 314 are an n-type. However, the first through fourth doping regions 311 through 314 are not limited thereto.

On the substrate 111 between the first and second doping regions 311 and 312, a plurality of insulating materials 112 extending along the first direction may be sequentially provided along the second direction. For example, the plurality of insulating materials 112 and the substrate 111 may be spaced apart along the second direction. For example, the plurality of insulating materials 112 may be formed to be separated by a desired (or alternatively predetermined) distance along the second direction. In example embodiments, the insulating materials 112 may include an insulating material such as silicon oxide.

On the substrate 111 between the first and second doping regions 311 and 312, a plurality of pillars 113 may be provided which are sequentially disposed along the first direction and pass through the insulating materials 112 along the second direction. In example embodiments, the pillars 113 may contact with the substrate 111 through the insulating materials 112, respectively.

In example embodiments, each of the pillars 113 may be formed of a plurality of materials. For example, a surface layer 114 of each pillar 113 may include a first-type silicon material. For example, the surface layer 114 of each pillar 113 may include a silicon material doped with the same type as the substrate 111. Hereinafter, it is assumed that the surface layer 114 of each pillar 113 includes p-type silicon. However, the surface layer 114 of each pillar 113 is not limited thereto.

An inner layer 115 of each pillar 113 may be formed of an insulating material. For example, the inner layer 115 of each pillar 113 may include an insulating material such as silicon oxide, but example embodiments of inventive concepts are not limited thereto.

Between the first and second doping regions 311 and 312, an insulating film 116 may be provided along exposed surfaces of the substrate 111, the insulating materials 112, and the pillars 113. For example, the thickness of the insulating film 116 may be less than half a distance between the insulating materials 112. That is, a region where a material other than the insulating materials 112 and the insulating film 116 is disposed may be provided between an insulating film 116 provided on a lower surface of a first insulating material among the insulating materials 112 and an insulating film 116 provided on an upper surface of a second insulating material and at the lower portion of the first insulating material.

Between the first and second doping regions 311 and 312, conductive materials 211 through 291 may be provided on an exposed surface of the insulating film 116. For example, a conductive material 211 extending along the first direction may be provided between the substrate 111 and the insulating material 112 adjacent to the substrate 111. In detail, the conductive material 211 extending along the first direction may be provided between the substrate 111 and the insulating film 116 at a lower surface of the insulating material adjacent to the substrate 111.

A conductive material extending along the first direction may be provided between an insulating film 116 on an upper surface of a specific insulating material of the insulating materials 112 and an insulating film 116 on a lower surface of an insulating material disposed at a top of the specific insulating material.

A plurality of conductive materials 221 through 281 extending along the first direction may be provided among the insulating materials 112. Further, a conductive material 291 extending along the first direction may be provided on the insulating materials 112. In example embodiments, the conductive materials 211 through 291 may be a metal material. For example, the conductive materials 211 through 291 may be a conductive material such as polysilicon.

The same structure as that on the first and second doping regions 311 and 312 may be provided between the second and third doping regions 312 and 313. Between the second and third doping regions 312 and 313, there may be provided the insulating materials 112 extending along the first direction, the pillars 113 sequentially disposed in the first direction and passing through the insulating materials 112 along the second direction, the insulating film 116 provided on exposed surfaces of the pillars 113 and the insulating materials 112, and the conductive materials 212 through 292 extending along the first direction.

The same structure as that on the first and second doping regions 311 and 312 may be provided between the third and fourth doping regions 313 and 314. Between the third and fourth doping regions 313 and 314, there may be provided the insulating materials 112 extending along the first direction, the pillars 113 sequentially disposed in the first direction and passing through the insulating materials 112 in the third direction, the insulating film 116 provided on the exposed surfaces of the insulating materials 112 and the pillars 113, and the first conductive materials 213 through 293 extending along the first direction.

Drains 320 may be provided on the pillars 113, respectively. In example embodiments, the drains 320 may include a second-type silicon material. For example, the drains 320 may be an n-type silicon material. Hereinafter, it is assumed that the drains 320 include an n-type silicon material. However, the drains 320 are not limited thereto. In example embodiments, a width of each drain 320 may be wider than that of a corresponding pillar 113. For example, each drain 320 may be provided on a corresponding pillar 113 to have a pad shape.

Conductive materials 331 through 333 extending along the third direction may be provided on the drains 320. The conductive materials 331 through 333 may be sequentially disposed along the first direction. The conductive materials 331 through 333 may be connected to the drains 320 of corresponding regions, respectively. In example embodiments, the drains 320 and the second conductive material 333 extending along the third direction may be connected through contact plugs. In example embodiments, the conductive materials 331 through 333 may be a metal material. For example, the conductive materials 331 through 333 may be a conductive material such as polysilicon.

In FIGS. 14 and 15, each pillar 113 may form a string together with an adjacent region of an insulating film 116 and an adjacent region among the conductive lines 211 through 291, 212 through 292, and 213 through 293 extending along the first direction. For example, each pillar 113 may form a NAND string NS together with an adjacent region of an insulating film 116 and an adjacent region among the conductive lines 211 through 291, 212 through 292, and 213 through 293 extending along the first direction. The NAND string NS may include a plurality of transistor structures TS. The transistor structure TS will be more fully described with reference to FIG. 16.

Figure 16:
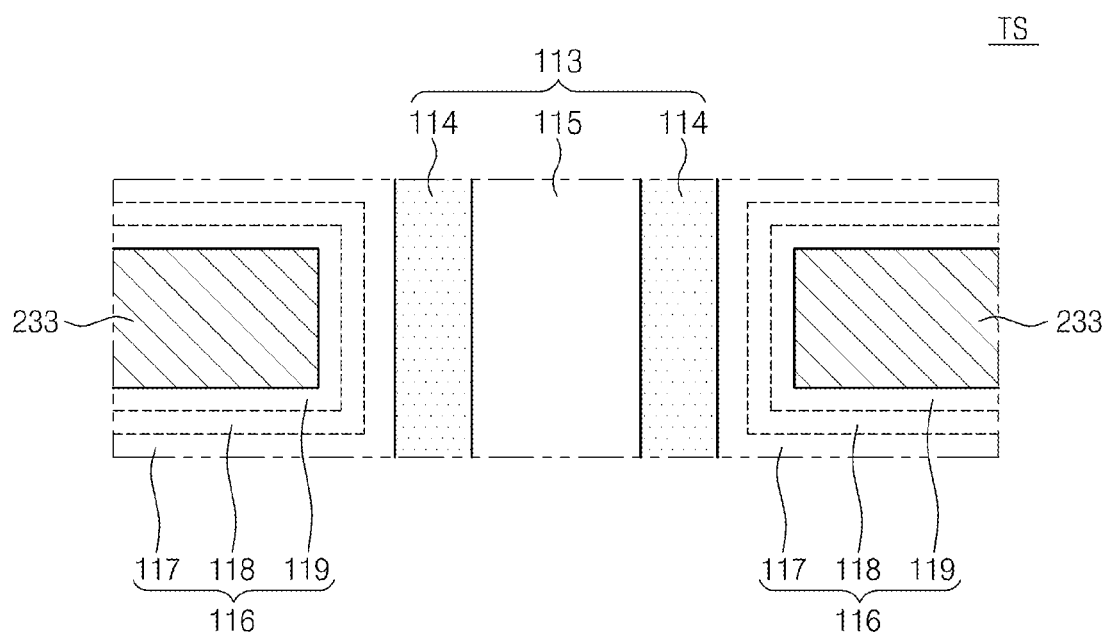
FIG. 16 is a cross-sectional view of a transistor structure TS in FIG. 15.

FIG. 16 is a cross-sectional view of a transistor structure TS in FIG. 15. Referring to FIGS. 14 through 16, an insulating film 116 may include first to third sub-insulating films 117 through 119.

A p-type silicon surface layer 114 of a pillar 113 may act as a body. The first sub-insulating film 117 may act as a tunneling insulating film. For example, the first sub-insulating film 117 adjacent to the pillar 113 may include a thermal oxide layer.

The second sub-insulating film 118 may act as a charge storage film. For example, the second sub-insulating film 118 may act as a charge trap layer. For example, the second sub-insulating film 118 may include a nitride layer or a metal oxide layer (e.g., an aluminum oxide layer, a hafnium oxide layer, or the like).

The third sub-insulating film 119 adjacent to a first conductive material 233 may act as a blocking insulating film. In example embodiments, the third sub-insulating film 119 adjacent to a conductive material 233 extending along a first direction may be a single layer or a multi-layer. The third sub-insulating film 119 may be a high dielectric layer (e.g., an aluminum oxide layer or a hafnium oxide layer) having a larger dielectric constant compared with the first and second sub-insulating films 117 and 118.

The conductive material 233 may serve as a gate (or a control gate). That is, the conductive material 233 serving as a gate (or a control gate), the third sub-insulating film 119 serving as the blocking insulating film, the second sub-insulating film 118 serving as the charge storage layer, the first sub-insulating film 117 serving as the tunneling insulation layer, and the p-type surface layer 114 serving as a body may form a transistor (or, a memory cell transistor structure). In example embodiments, the first through third sub-insulating films 117 through 119 may form oxide-nitride-oxide (ONO). Below, it is assumed that the p-type surface layer 114 of the pillar 113 serves as a second-direction body.

A memory block BLKi may include a plurality of pillars 113. That is, the memory block BLKi may include a plurality of NAND strings NS. In detail, the memory block BLKi may include a plurality of NAND strings NS extending along a second direction (or, a direction vertical to a substrate).

Each NAND string NS may include a plurality of transistor structures TS that are disposed along a second direction. At least one of the transistor structures TS of each NAND string NS may serve as a string selection transistor SST. At least one of the transistor structures TS of each NAND string NS may serve as a ground selection transistor GST.

Gates (or control gates) may correspond to conductive materials 211 through 291, 212 through 292, and 213 through 293 extending along a first direction. That is, the gates (or the control gates) may be extended in the first direction to form two selection lines (e.g., at least one string selection line SSL and at least one ground selection line GSL) and word lines extending along the first direction.

Conductive materials 331 through 333 extending in a third direction may be connected to one ends of the NAND strings NS, respectively. Conductive materials 331 through 333 may act as bit lines BL. In the memory block BLK1, one bit line may be connected with a plurality of NAND strings.

Second-type doping regions 311 through 314 extending in the first direction may be provided to other ends of the NAND strings NS, respectively. The second-type doping regions 311 through 314 may serve as common source lines CSL.

To sum up the above description, the memory block BLKi may include a plurality of NAND strings that extend in a direction (i.e., the second direction) vertical to the substrate 111, and may be a NAND flash memory block (e.g., a charge trap type) in which a plurality of NAND strings NS may be connected to one bit line BL.

FIGS. 14 to 16 were described under the assumption that first conductive lines 211 through 291, 212 through 292, and 213 through 293 extending along the first direction are formed at nine layers. However, example embodiments of inventive concepts are not limited thereto. For example, conductive lines extending along the first direction may be provided at 8, 16, or plural layers. That is, one NAND string may include 8, 16, or plural transistors.

FIGS. 14 through 16 were described under the assumption that three NAND strings NS are connected to a bit line. However, example embodiments of inventive concepts are not limited thereto. In example embodiments, in a memory block BLKi, m NAND strings NS may be connected to a bit line BL. At this time, the number of conductive materials 211 through 291, 212 through 292, and 213 through 293 extending along the first direction and the number of common source lines 311 through 314 may be adjusted according to the number of NAND strings NS connected to a bit line BL.

FIGS. 14 through 16 were described under the assumption that three NAND strings NS are connected to a conductive material extending along the first direction. However, example embodiments of inventive concepts are not limited thereto. For example, n NAND strings NS may be connected to a conductive material extending along the first direction. At this time, the number of bit lines 331 through 333 may be adjusted according to the number of NAND strings connected to a bit line extending along the first direction.

Figure 17:
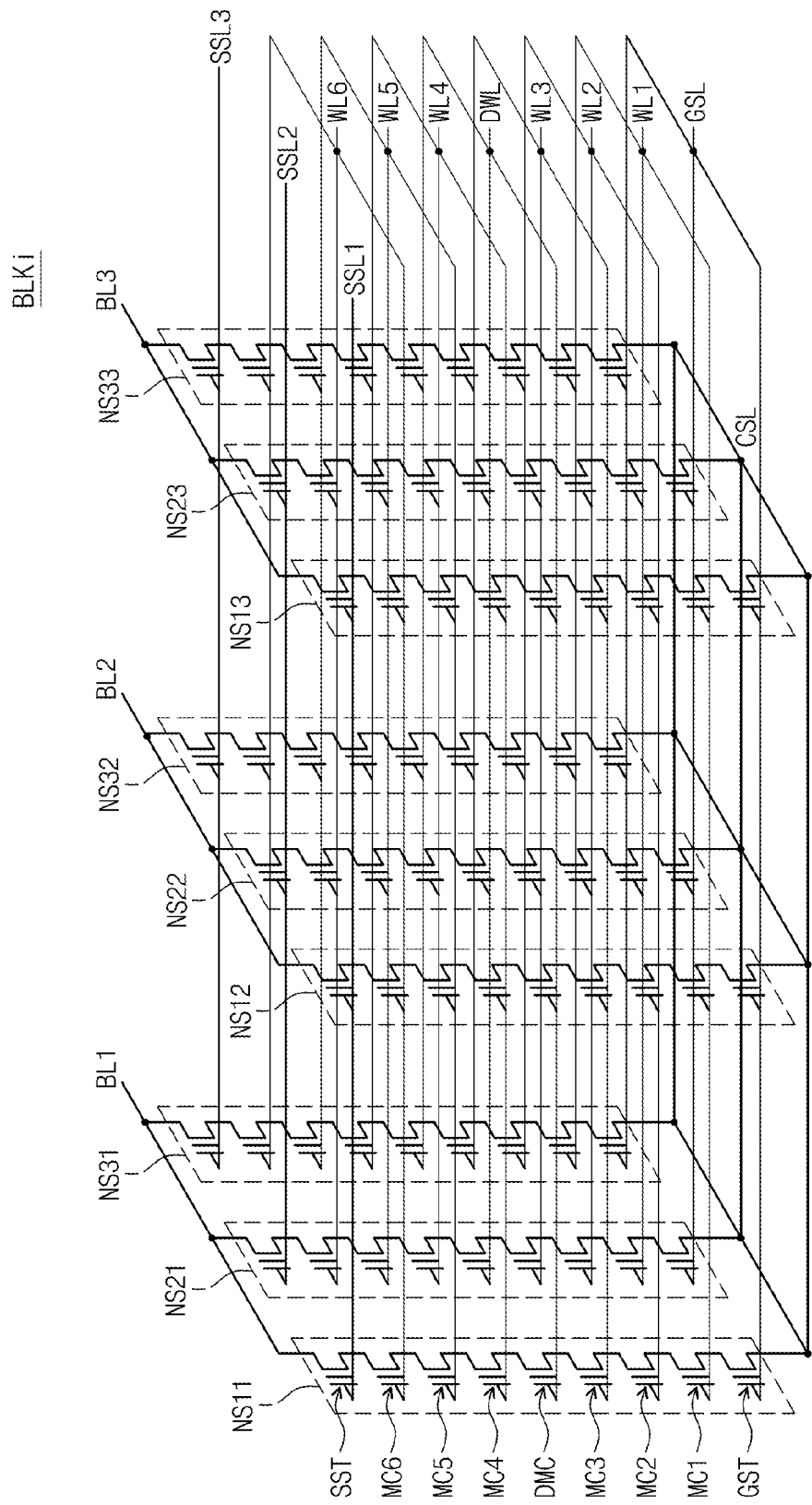
FIG. 17 is an equivalent circuit diagram of a memory block described with reference to FIGS. 14 through 16.

FIG. 17 is an equivalent circuit diagram of a memory block described with reference to FIGS. 14 through 16. Referring to FIGS. 14 through 17, NAND strings NS11, NS21, and NS31 may be provided between a first bit line BL1 and a common source line CSL. NAND strings NS12, NS22, and NS32 may be provided between a second bit line BL2 and the common source line CSL. NAND strings NS13, NS23, and NS33 may be provided between a third bit line BL3 and the common source line CSL. The first through third bit lines BL1 through BL3 may correspond to conductive material 331 through 333 extending in the third direction, respectively.

A string selection transistor SST of each NAND string NS may be connected to a corresponding bit line BL. A ground selection transistor GST of each NAND string NS may be connected to the common source line CSL. In each NAND string NS, memory cells MC may be provided between the string selection transistor SST and the ground selection transistor GST.

Below, NAND strings NS may be defined by the row and by the column. The NAND strings NS connected to one bit line in common may form one column. For example, the NAND strings NS11 through NS31 connected to the first bit line BL1 may correspond to a first column. The NAND strings NS12 through NS32 connected to the second bit line BL2 may correspond to a second column. The NAND strings NS13 through NS33 connected to the third bit line BL3 may correspond to a third column. The NAND strings NS connected to one string selection line SSL may form one row. For example, the NAND strings NS11 through NS13 connected to a first string selection line SSL1 may form a first row. The NAND strings NS21 through NS23 connected to a second string selection line SSL2 may form a second row. The NAND strings NS31 through NS33 connected to a third string selection line SSL3 may form a third row.

In each NAND string NS, a height may be defined. In example embodiments, in each NAND string NS, a memory cell MC1 adjacent to the ground selection transistor GST may be defined to have a height of 1. In each NAND string NS, a height of a memory cell may increase in inverse proportion to a distance from a string selection transistor SST. In each NAND string NS, a memory cell MC7 adjacent to the string selection transistor SST may be defined to have a height of 7.

NAND strings in the same row may share the string selection line SSL. NAND strings in different rows may be connected to different string selection lines SSL1, SSL2, and SSL3, respectively.

In each NAND string NS in the same row, memory cells having the same height may share a word line WL. At the same height, word lines WL connected to memory cells of NAND strings in different rows may be connected in common. In each NAND string in the same row, dummy memory cells having the same height may share a dummy word line DWL. At the same height, dummy word lines WL connected to memory cells of NAND strings in different rows may be connected in common.

In example embodiments, the word lines WL or the dummy word lines DWL may be connected in common at a layer where conductive materials 211 through 291, 212 through 292, and 213 through 293 extending along a first direction are provided. In example embodiments, the conductive materials 211 through 291, 212 through 292, and 213 through 293 extending along the first direction may be connected to an upper layer via contacts. The conductive materials 211 through 291, 212 through 292, and 213 through 293 extending along the first direction may be connected in common at the upper layer. In the same row of NAND strings NS, ground selection transistors GST may share a ground selection line GSL. In different rows of NAND strings NS, ground selection transistors GST may share the ground selection line GSL. That is, the NAND strings NS11 through NS13, NS21 through NS23, and NS31 through NS33 may be connected in common to the ground selection line GSL.

The common source line CSL may be connected in common to NAND strings NS. For example, first through fourth doping regions 311 through 314 may be interconnected at an active region of a substrate 111. For example, the first through fourth doping regions 311 through 314 may be connected to an upper layer via contacts. The first through fourth doping regions 311 through 314 may be connected in common at the upper layer.

As illustrated in FIG. 17, word lines placed at the same height may be connected in common. Thus, when a word line placed at a specific height is selected, all NAND strings connected with the selected word line may be selected. NAND strings in different rows may be connected to different string selection lines. Thus, NAND strings in an unselected row from among NAND strings connected with the same word line may be separated from a corresponding bit line by selecting the string selection lines SSL1 through SSL3. That is, a row of NAND strings may be selected by selecting and unselecting the string selection lines SSL1 through SSL3. A column of NAND strings in a selected row may be selected by selecting bit lines BL1 through BL3.

Each NAND string NS may include a dummy memory cell DMC. First through third memory cells MC1 through MC3 may be provided between the dummy memory cell DMC and a ground selection transistor GST. Fourth through sixth memory cells MC4 through MC6 may be provided between the dummy memory cell DMC and a string selection transistor SST. Below, it is assumed that memory cells MC of each NAND string NS are divided into memory cell groups by the dummy memory cell DMC. Memory cells (e.g., MC1 through MC3) adjacent to the ground selection transistor GST may form a lower memory cell group. Memory cells (e.g., MC4 through MC6) adjacent to the string selection transistor SST may form an upper memory cell group.

A function of a coupling program control unit according to example embodiments of inventive concepts may be applied to a three-dimensional (3D) flash memory device. The 3D flash memory device according to example embodiments of inventive concepts may perform programming of a data pattern using a coupling effect.

Figure 18:
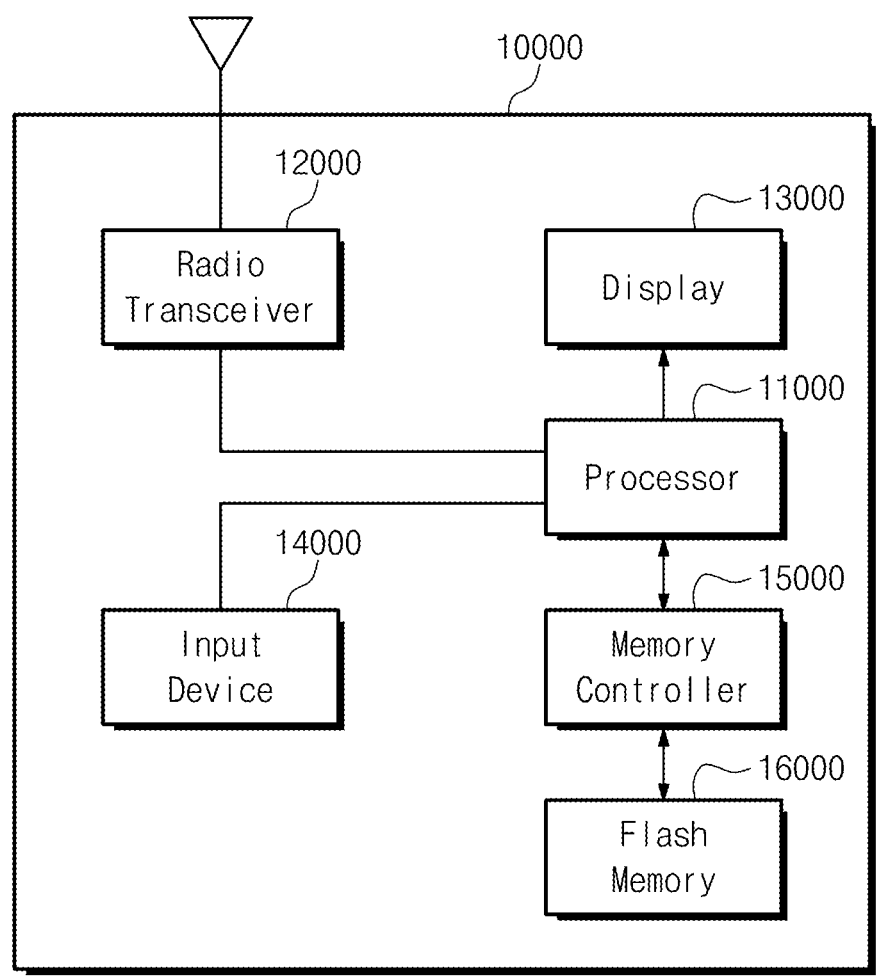
FIG. 18 is a block diagram schematically illustrating an electronic device including a nonvolatile memory device according to example embodiments of inventive concepts.

FIG. 18 is a block diagram schematically illustrating an electronic device including a nonvolatile memory device according to example embodiments of inventive concepts.

Referring to FIG. 18, an electronic device 10000 such as a cellular phone, a smart phone, or a tablet PC may include a nonvolatile memory device 16000 formed of a flash memory device and a memory controller 15000 controlling an operation of the nonvolatile memory device 16000.

The nonvolatile memory device 16000 may correspond to a nonvolatile memory device described in relation to FIGS. 1 and 2. The nonvolatile memory device 16000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended.

The memory controller 15000 may correspond to a memory controller illustrated in FIG. 1. The memory controller 15000 may be controlled by a processor 11000 controlling an overall operation of the electronic device 10000.

Data stored in the nonvolatile memory device 16000 may be displayed via a display 13000 under the control of the memory controller 15000 that operates in response to the control of a processor 11000.

A radio transceiver 12000 may transmit and receive a radio signal via an antenna. For example, the radio transceiver 12000 may convert a radio signal received via the antenna to a signal suitable for the processor 11000 to process. The processor 11000 may process a signal output from the radio transceiver 12000, and the processed signal may be stored in the nonvolatile memory device 16000 via the memory controller 15000 or displayed via the display 13000.

The radio transceiver 12000 may convert a signal from the processor 11000 to a radio signal to output it to an external device via the antenna.

An input device 14000 may be a device capable of receiving a control signal for controlling an operation of the processor 11000 or data to be processed by the processor 11000.

The input device 14000 may include a pointing device such as a touch pad or a computer mouse, a keypad, or a keyboard.

The processor 11000 may control the display 13000 so as to display data output from the nonvolatile memory device 16000, a radio signal from the radio transceiver 12000, or data from the input device 14000.

Figure 19:
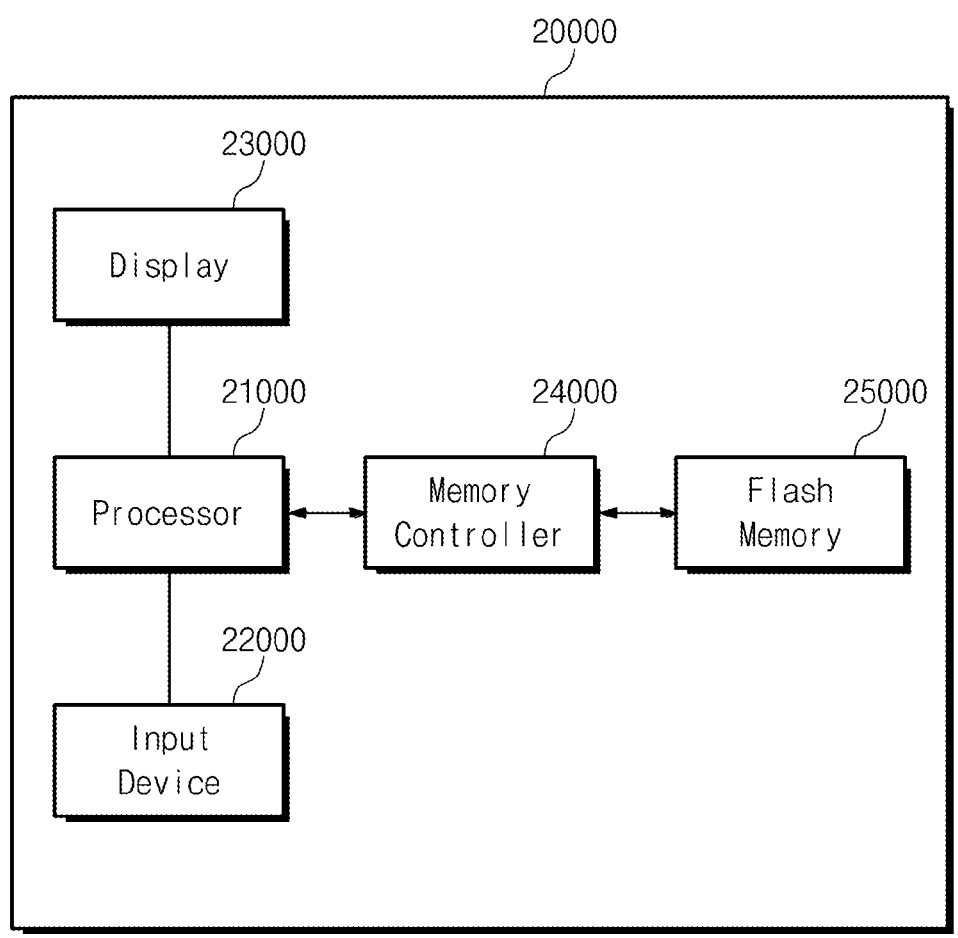
FIG. 19 is a block diagram schematically illustrating an electronic device including a memory controller and a nonvolatile memory device according to example embodiments of inventive concepts.

FIG. 19 is a block diagram schematically illustrating an electronic device including a memory controller and a nonvolatile memory device according to example embodiments of inventive concepts.

Referring to FIG. 19, an electronic device 20000 may be a data processing device such as a personal computer, a tablet computer, a net-book, an e-reader, a PDA, a PMP, an MP3 player, or an MP4 player, and may include a nonvolatile memory device 25000 such as a flash memory device and a memory controller 24000 controlling an operation of the nonvolatile memory device 25000.

The nonvolatile memory device 25000 may correspond to a nonvolatile memory device described in relation to FIGS. 1 and 2. The nonvolatile memory device 25000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended.

The memory controller 24000 may correspond to a memory controller illustrated in FIG. 1. The electronic device 20000 may include a processor 21000 controlling an overall operation of the electronic device 20000. The memory controller 24000 may be controlled by the processor 21000.

The processor 21000 may display data, stored in a nonvolatile memory device, via a display according to an input signal generated by an input device 22000. For example, the input device 22000 may be formed of a pointing device such as a touch pad or a computer mouse, a keypad, or a keyboard.

Figure 20:
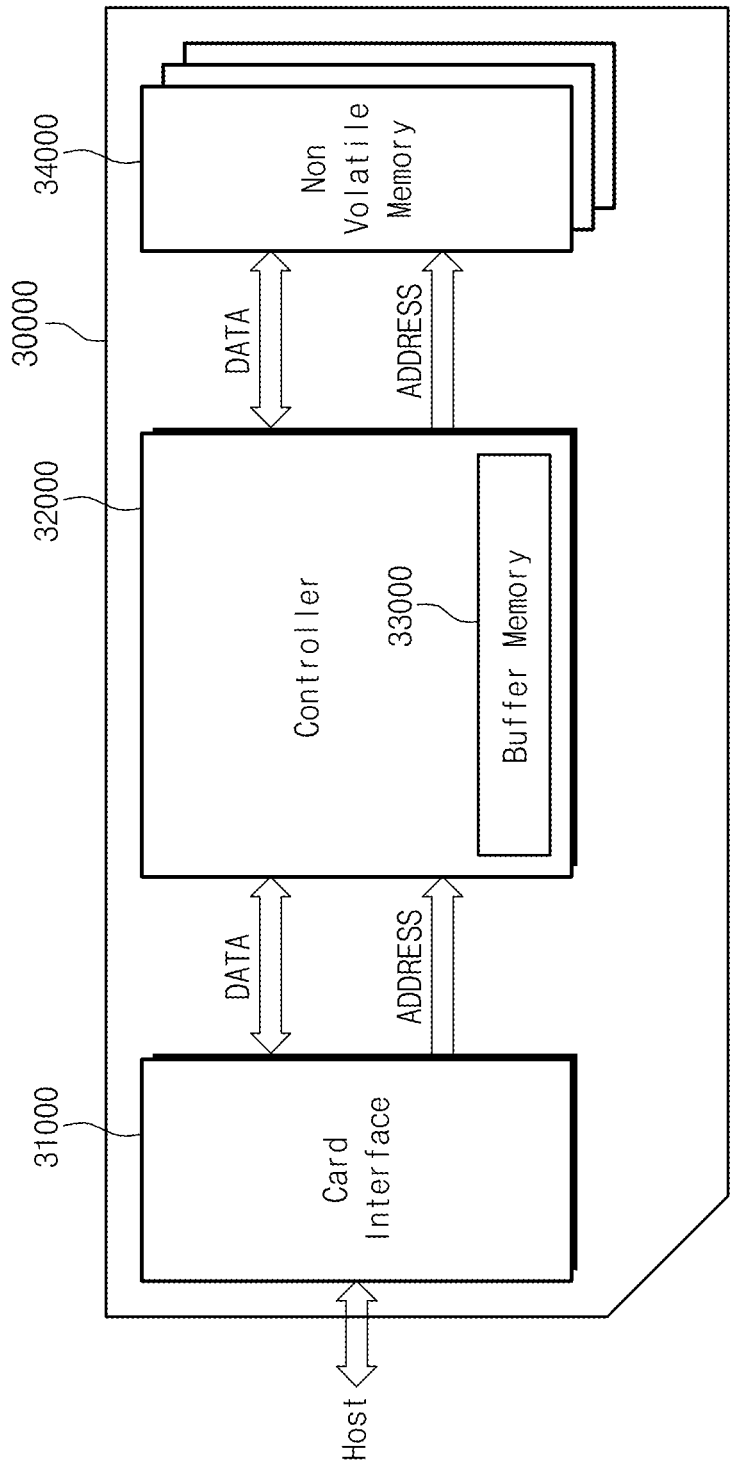
FIG. 20 is a block diagram schematically illustrating an electronic device including a nonvolatile memory device according to example embodiments of inventive concepts.

FIG. 20 is a block diagram schematically illustrating an electronic device including a nonvolatile memory device according to example embodiments of inventive concepts. Referring to FIG. 20, an electronic device 30000 may include a card interface 31000, a memory controller 32000, and at least one nonvolatile memory device 34000, for example, a flash memory device.

The electronic device 30000 may exchange data with a host via card interface 31000. In example embodiments, the card interface 31000 may be an SD card interface or an MMC interface. However, example embodiments of inventive concepts are not limited thereto. The card interface 31000 may exchange data between the host and the memory controller 32000 according to the communication protocol of the host capable of communicating with the electronic device 30000.

The memory controller 32000 may control an overall operation of the electronic device 30000, and may control data exchange between the card interface 31000 and the nonvolatile memory device 34000. A buffer memory 33000 of the memory controller 32000 may buffer data transferred between the card interface 31000 and the at least one nonvolatile memory device 34000.

The memory controller 32000 may be connected to the card interface 31000 and the nonvolatile memory device 34000 via a data bus and an address bus. In example embodiments, the memory controller 32000 may receive an address of data to be read or written via the address bus from the card interface 31000 to send it to the at least one nonvolatile memory device 34000.

The memory controller 32000 may receive or send data to be read or to be written via the data bus connected to the card interface 31000 or the at least one nonvolatile memory device 34000.

The at least one nonvolatile memory device 34000 may correspond to a nonvolatile memory device described in relation to FIGS. 1 and 2. The at least one nonvolatile memory device 34000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 32000 may correspond to a memory controller illustrated in FIG. 1.

When the electronic device 30000 in FIG. 20 is connected to a host such as a PC, a tablet PC, a digital camera, a digital audio player, a cellular phone, a console video game hardware, or a digital set-top box, the host may send or receive data stored in the nonvolatile memory device 34000 via the card interface 31000 and the memory controller 32000.

Figure 21:
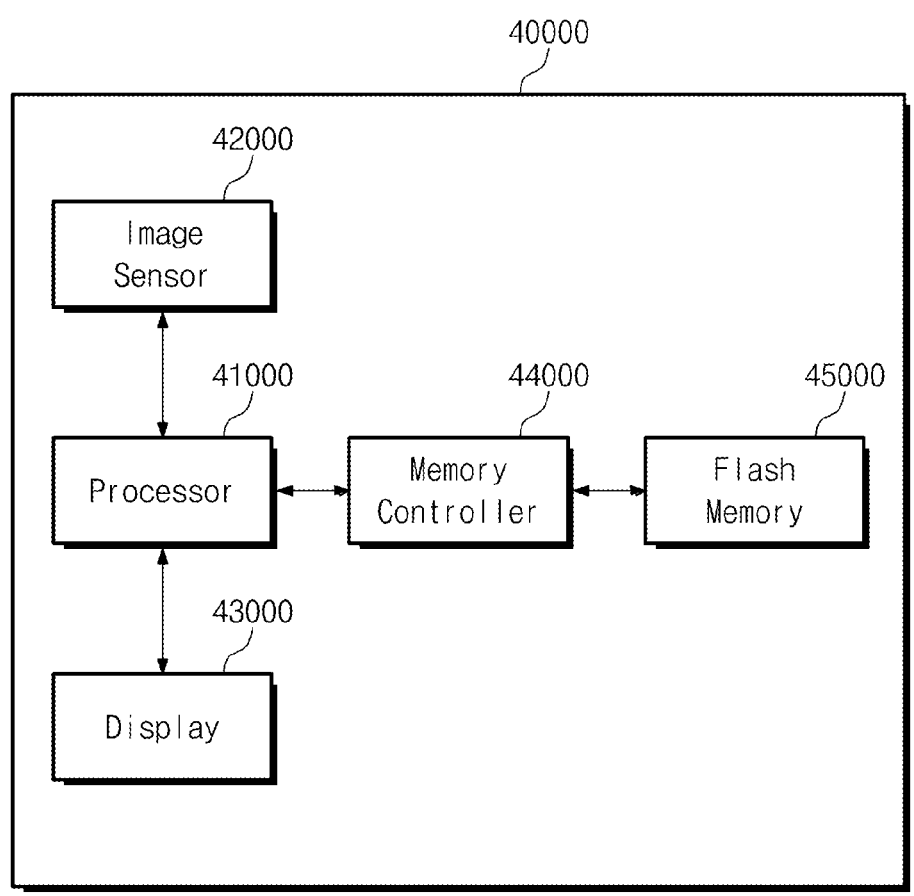
FIG. 21 is a block diagram schematically illustrating an electronic device including a memory controller and a nonvolatile memory device according to example embodiments of inventive concepts.

FIG. 21 is a block diagram schematically illustrating an electronic device including a memory controller and a nonvolatile memory device according to example embodiments of inventive concepts. Referring to FIG. 21, an electronic device 40000 may include a nonvolatile memory device 45000 such as a flash memory device, a memory controller 44000 controlling a data processing operation of the nonvolatile memory device 45000, and a processor 41000 controlling an overall operation of the electronic device 40000.

The nonvolatile memory device 45000 may correspond to a nonvolatile memory device described in relation to FIGS. 1 and 2. The nonvolatile memory device 45000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 44000 may correspond to a memory controller illustrated in FIG. 1.

An image sensor 42000 of the electronic device 40000 may convert an optical signal to a digital signal, and the digital signal may be stored in the nonvolatile memory device 45000 or displayed via a display 43000 under the control of the processor 41000.

Figure 22:
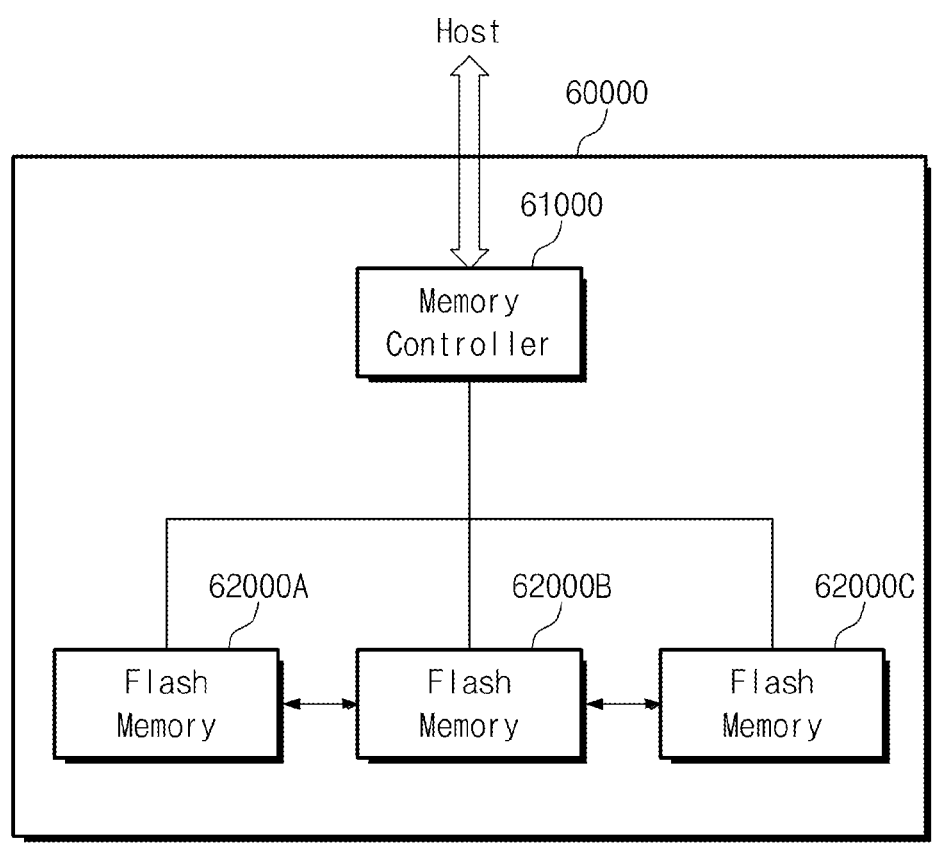
FIG. 22 is a block diagram schematically illustrating an electronic device including a memory controller and nonvolatile memory devices according to example embodiments of inventive concepts.

FIG. 22 is a block diagram schematically illustrating an electronic device including a memory controller and nonvolatile memory devices according to example embodiments of inventive concepts. Referring to FIG. 22, an electronic device 60000 may be implemented by a data storage device such as a Solid State Drive (SSD).

The electronic device 60000 may include a plurality of nonvolatile memory devices 62000A, 62000B, and 62000C and a memory controller 61000 controlling a data processing operation of each of the plurality of nonvolatile memory devices 62000A, 62000B, and 62000C. The electronic device 60000 may be implemented by a memory system or a memory module.

Each of the nonvolatile memory devices 62000A, 62000B, and 62000C may be a nonvolatile memory device described in FIGS. 1 and 2. Each of the nonvolatile memory devices 62000A, 62000B, and 62000C may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 61000 may correspond to a memory controller illustrated in FIG. 1.

In example embodiments, the memory controller 61000 may be provided at the interior or exterior of the electronic device 60000.

Figure 23:
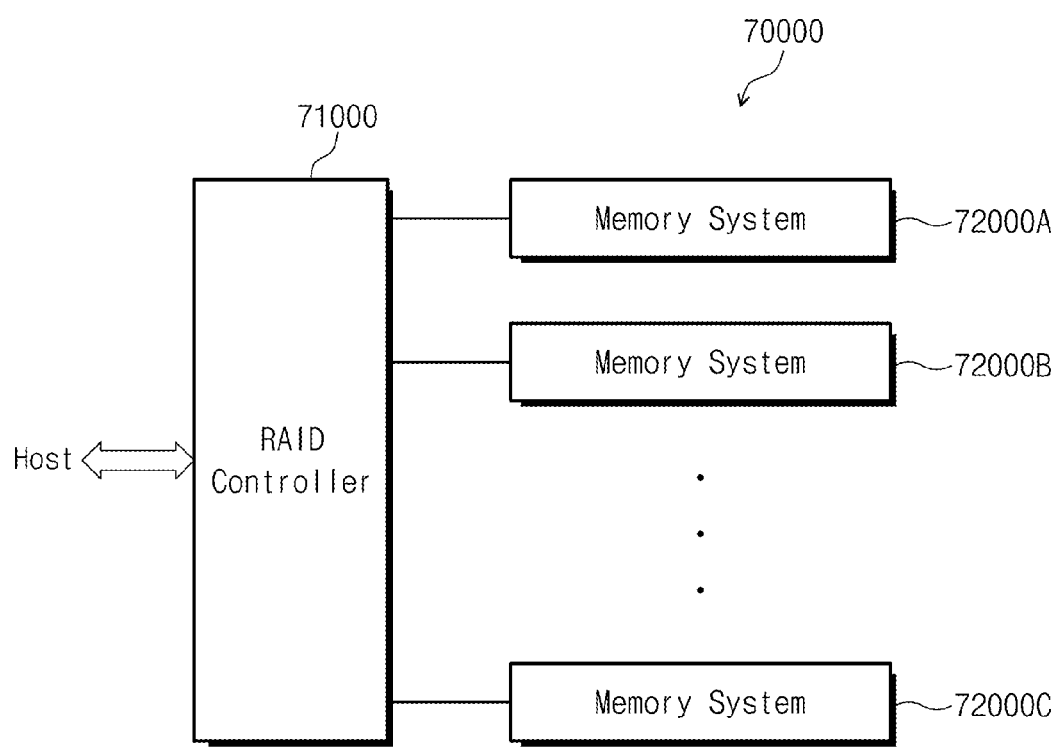
FIG. 23 is a block diagram schematically illustrating a data processing system including an electronic device in FIG. 22.

FIG. 23 is a block diagram schematically illustrating a data processing system including an electronic device in FIG. 22. Referring to FIGS. 22 and 23, a data storage device 70000 may be implemented by a RAID (Redundant Array of Independent Disks) system, and may include a RAID controller 71000 and a plurality of memory systems 72000A to 72000C.

The memory systems 72000A to 72000C may be an electronic device 60000 illustrated in FIG. 22. The memory systems 72000A to 72000C may constitute a RAID array. The data storage device 70000 may be implemented by a personal computer or an SSD.

During a program operation, the RAID controller 71000 may output program data from a host to one of the memory systems 72000A to 72000C according to a RAID level, selected depending on RAID level information from the host, from among a plurality of RAID levels.

During a read operation, the RAID controller 71000 may provide the host with data read from one of the memory systems 72000A to 72000C according to a RAID level, selected depending on RAID level information from the host, from among a plurality of RAID levels.

The above-disclosed subject matter is to be considered illustrative, and not restrictive, and the appended claims are intended to cover all such modifications, enhancements, and other variations, which fall within the true spirit and scope of the following claims. Thus, to the maximum extent allowed by law, the scope is to be determined by the broadest permissible interpretation of the following claims and their equivalents, and shall not be restricted or limited by the foregoing detailed description.

What is claimed is:
1. A nonvolatile memory device comprising:
a first memory cell configured to store a first data pattern;
a second memory cell configured to be programmed using a program voltage;
a first word line connected to the first memory cell;
a second word line connected to the second memory cell, the first word line being adjacent to the second word line; and
a coupling program control unit,
the coupling program control unit being configured to perform a verification operation for verifying whether the first memory cell is programmed with the first data pattern,
the verification operation providing to the first memory cell a verification voltage corresponding to the first data pattern,
the coupling program control unit being configured to shift a threshold voltage of the first memory cell by programming the second memory cell using the program voltage at a time when the first memory cell is not being programmed using the program voltage,
the coupling program control unit being configured to end programming the second memory cell when the verification operation on the first memory cell indicates a pass, wherein
during a first program period, the coupling program control unit is configured to apply a first level of the program voltage to the second word line and then apply the verification voltage to not the second word line, but the first word line, the coupling program control unit is configured to apply a second level of the program voltage higher than the first level of the program voltage when the verification operation of the first memory cell following the first program period indicates a fail and apply the verification voltage to the first word line after applying the second level program voltage to the second word line.

2. The nonvolatile memory device of claim 1, further comprising:

a memory controller connected to the first and second memory cells, wherein the second memory cell is a dummy memory cell that does not have a data pattern provided from a memory controller.

3. The nonvolatile memory device of claim 1, wherein the first data pattern has an uppermost threshold voltage of a multi-level data pattern.

4. The nonvolatile memory device of claim 1, the coupling program control unit is configured to perform the verification operation by applying the verification voltage to the first word line, and the coupling program control unit is configured to shift the threshold voltage of the first memory cell by applying the first level of the program voltage to the second word line when the first level of the program voltage is not being applied to the first word line.

5. The nonvolatile memory device of claim 1, further comprising:

a plurality of memory cells in the nonvolatile memory device, wherein the plurality of memory cells include the first memory cell and the second memory cell, the plurality of memory cells are arranged in a plurality of vertical strings, and each one of the plurality of vertical strings includes some of the plurality of memory cells stacked on top of each other between a ground selection transistor and a string selection transistor.

6. A nonvolatile memory device comprising:

a first memory cell configured to store a first data pattern;

a second memory cell configured to be supplied with a program voltage;

a first word line connected to the first memory cell;

a second word line connected to the second memory cell, the first word line being adjacent to the second word line; and a coupling program control unit configured to provide the second memory cell with the program voltage according to the first data pattern and a program state of the first memory cell, the coupling program control unit being configured to shift a threshold voltage of the first memory cell by programming the second memory cell using the program voltage at a time when the first memory cell is not being programmed using the program voltage, wherein during a first program period, the coupling program control unit is configured to apply a first level of the program voltage to the second word line and then apply a verification voltage to not the second word line but the first word line, and the coupling program control unit is configured to apply a second level of the program voltage higher than the first level of the program voltage when the verification operation of the first memory cell following the first program period indicates a fail and apply the verification voltage to the first word line after applying the second level of program voltage to the second word line.

7. The nonvolatile memory device of claim 6, further comprising:

a memory controller connected to the first and second memory cell, wherein the second memory cell is a dummy memory cell in which a data pattern provided from the memory controller is not stored.

8. The nonvolatile memory device of claim 6, wherein the coupling program control unit is further configured to perform a verification operation for verifying whether the first memory cell is programmed with the first data pattern, the verification operation providing to the first memory cell a verification voltage corresponding to the first data pattern, and the coupling program control unit is configured to provide the program voltage to the second memory cell when the verification operation on the first memory cell indicates a failure.

9. The nonvolatile memory device of claim 8, wherein the first data pattern has an uppermost threshold voltage of a multi-level data pattern.

10. The nonvolatile memory device of claim 8, wherein the first and second memory cells are adjacent to each other.

11. The nonvolatile memory device of claim 6, wherein the coupling program control unit is configured to perform the verification operation by applying the verification voltage to the first word line, and the coupling program control unit is configured to shift the threshold voltage of the first memory cell by applying the first level of the program voltage to the second word line at the time when the first level of the program voltage is not being applied to the first word line.

12. The nonvolatile memory device of claim 6, further comprising:

a plurality of memory cells in the nonvolatile memory device, wherein the plurality of memory cells include the first memory cell and the second memory cell, the plurality of memory cells are arranged in a plurality of vertical strings, and each one of the plurality of vertical strings includes some of the plurality of memory cells stacked on top of each other between a ground selection transistor and a string selection transistor.

13. A nonvolatile memory device comprising:

an array of memory cells including a first memory cell adjacent to a second memory cell;

a first word line connected to the first memory cell;

a second word line connected to the second memory cell, the first word line being adjacent to the second word line; and a control circuit connected to the array of memory cells, the control circuit being configured to detect whether the first memory cell passes or fails a verification operation, the control circuit being configured to shift a threshold voltage of the first memory cell by supplying a program voltage to the second memory cell when the first memory cell fails the verification operation, and the control circuit being configured to supply the program voltage to the second memory cell at a time when the program voltage is not being supplied to the first memory cell, wherein during a first program period, the control circuit is configured to apply a first level of the program voltage to the second word line and then apply a verification voltage to not the second word line but the first word line, the control circuit is configured to apply a second level of the program voltage higher than the first level of the program voltage when the verification operation of the first memory cell following the first program period indicates a fail and apply the verification voltage to the first word line after applying the second level of program voltage to the second word line.

14. The nonvolatile memory device of claim 13, wherein the first memory cell is configured to store a first data pattern, the control circuit is configured to perform the verification operation by providing a verification voltage corresponding to the first data pattern along the first word line to the first memory cell in order to check whether the first memory cell is programmed with the first data pattern, and the control circuit is configured to end supplying the program voltage along the second word line to the second memory cell when the control circuit detects the first memory cell passes the verification operation.

15. The nonvolatile memory device of claim 14, wherein the first data pattern has an uppermost threshold voltage of a multi-level data pattern.

16. The nonvolatile memory device of claim 13, wherein the array of memory cells further includes a common bit line connected to the first memory cell and the second memory cell.

17. The nonvolatile memory system comprising:
a memory controller connected to at least one nonvolatile memory device according to claim 13.

18. The nonvolatile memory device of claim 13,
the coupling program control unit is configured to apply a verification voltage to the first word line during the verification operation, and the coupling program control unit is configured to shift the threshold voltage of the first memory cell by applying the first level of the program voltage to the second word line when the first level of the program voltage is not being applied to the first word line.

19. The nonvolatile memory device of claim 13, further comprising:
a plurality of memory cells in the nonvolatile memory device, wherein the plurality of memory cells include the first memory cell and the second memory cell, the plurality of memory cells are arranged in a plurality of vertical strings, and each one of the plurality of vertical strings includes some of the plurality of memory cells stacked on top of each other between a ground selection transistor and a string selection transistor.

* * * * *